US011191190B2

(12) United States Patent
Stefanoski et al.

(10) Patent No.: US 11,191,190 B2
(45) Date of Patent: Nov. 30, 2021

(54) TWO-PHASE COOLING SYSTEMS FOR AUTONOMOUS DRIVING SUPER COMPUTERS

(71) Applicant: GM Cruise Holdings LLC, San Francisco, CA (US)

(72) Inventors: Zoran Stefanoski, San Francisco, CA (US); Robert Cao, San Francisco, CA (US)

(73) Assignee: GM Cruise Holdings, LLC, San Francisco, CA (US)

( * ) Notice: Subject to any disclaimer, the term of this patent is extended or adjusted under 35 U.S.C. 154(b) by 0 days.

(21) Appl. No.: 16/836,709

(22) Filed: Mar. 31, 2020

(65) Prior Publication Data

US 2021/0307209 A1 Sep. 30, 2021

(51) Int. Cl.
*H05K 7/20* (2006.01)
*B60W 60/00* (2020.01)

(52) U.S. Cl.
CPC ..... *H05K 7/20809* (2013.01); *B60W 60/0011* (2020.02); *H05K 7/20309* (2013.01); *H05K 7/20327* (2013.01); *H05K 7/20381* (2013.01); *H05K 7/20836* (2013.01)

(58) Field of Classification Search
CPC ........... H05K 7/20809; H05K 7/20309; H05K 7/20327; H05K 7/20381; H05K 7/20836; B60W 60/0011
See application file for complete search history.

(56) References Cited

U.S. PATENT DOCUMENTS 10,481,652 B2 * 11/2019 Rice ...................... H01L 23/473
2017/0127563 A1 * 5/2017 Chainer ................... F28F 27/02

2017/0363365 A1 * 12/2017 Aoki ....................... F28D 15/02
2018/0098459 A1 * 4/2018 Chainer ............... H01L 21/4882
2019/0171258 A1 6/2019 Rice et al.
2020/0001682 A1 * 1/2020 Lee .................... B60H 1/00492

FOREIGN PATENT DOCUMENTS

| CN | 209879440 U | 12/2019 |
| DE | 202011110555 U1 | 1/2015 |
| WO | 2011017385 A1 | 2/2011 |
| WO | 2011044445 A1 | 4/2011 |

OTHER PUBLICATIONS

International Search Report and Written Opinion for Application No. PCT/US2021/024957, dated Jul. 20, 2021, 12 Pages.

* cited by examiner

*Primary Examiner* — Mukundbhai G Patel
(74) *Attorney, Agent, or Firm* — Polsinelli, PC

(57) ABSTRACT

Two-phase cooling systems for autonomous driving super computers (ADSC) are described herein. In some examples, a two-phase cooling system can include a flow channel configured to circulate a flow; an evaporative heat exchanger comprising an inlet for receiving fluid from the flow channel and an outlet for releasing vapor generated from the fluid, the evaporative heat exchanger being configured to collect heat from components of the ADSC and transfer the heat away via the vapor released from the first outlet; a condensing heat exchanger configured to condense the vapor and remove latent heat associated with the vapor, the condensing heat exchanger comprising an inlet to the flow channel for receiving the vapor and an outlet to the flow channel for discharging fluid generated by condensing the vapor; and a pump configured to receive the fluid from the condensing heat exchanger and circulate the fluid to the evaporative heat exchanger.

20 Claims, 13 Drawing Sheets

600

602 — RELEASE, BY AN EVAPORATIVE HEAT EXCHANGER OF A TWO-PHASE COOLING SYSTEM FOR AN AUTONOMOUS DRIVING SUPER COMPUTER (ADSC), VAPOR GENERATED BY THE EVAPORATIVE HEAT EXCHANGER BASED ON FLUID RECEIVED FROM A FLOW CHANNEL

604 — TRANSFER, BY THE EVAPORATIVE HEAT EXCHANGER, HEAT AWAY FROM ONE OR MORE COMPONENTS OF THE ADSC

606 — RECEIVE, BY A CONDENSING HEAT EXCHANGER OF THE TWO-PHASE COOLING SYSTEM AND FROM THE FLOW CHANNEL, THE VAPOR RELEASED BY THE EVAPORATIVE HEAT EXCHANGER

608 — CONDENSE, BY THE CONDENSING HEAT EXCHANGER, THE VAPOR TO A FLUID TO REMOVE LATENT HEAT ASSOCIATED WITH THE VAPOR

610 — RECEIVE, BY A PUMP OF THE TWO-PHASE COOLING SYSTEM, THE FLUID FROM THE CONDENSING HEAT EXCHANGER

612 — CIRCULATE, BY THE PUMP, THE FLUID TO THE EVAPORATIVE HEAT EXCHANGER

FIG. 6

TWO-PHASE COOLING SYSTEMS FOR AUTONOMOUS DRIVING SUPER COMPUTERS

TECHNICAL FIELD

The present disclosure generally relates to thermal management for autonomous driving super computers.

BACKGROUND

An autonomous vehicle is a motorized vehicle that can navigate without a human driver. An exemplary autonomous vehicle can include various sensors, such as a camera sensor, a light detection and ranging (LIDAR) sensor, and a radio detection and ranging (RADAR) sensor, amongst others. The sensors collect data and measurements that the autonomous vehicle can use for operations such as navigation. The sensors can provide the data and measurements to an autonomous driving super computer (ADSC) of the autonomous vehicle, which can use the data and measurements to control a mechanical system of the autonomous vehicle, such as a vehicle propulsion system, a braking system, or a steering system. Typically, the ADSC is a high performance computing system with a wide array of electronic and compute components and systems that work together to perform a number of complex operations for the autonomous vehicle and control various systems on the autonomous vehicle.

Unfortunately, high performance computing systems in consumer and enterprise applications today are not equipped to handle the harsh and often unpredictable operating conditions of vehicles. For example, autonomous vehicles and internal components of autonomous vehicles, such as ADSCs, can experience a variety of harsh and often hazardous environmental and operating conditions such as extreme temperatures (e.g., extreme hot and/or cold temperatures), extreme temperature fluctuations, weather elements (e.g., wind, rain, snow, ice, humidity, etc.), potentially harmful environmental particles or matter (e.g., dust, dirt, grease, etc.), damaging forces (e.g., shock, vibrations, impacts, collisions, etc.), water, rough terrains, and other harsh or hazardous environmental and operating conditions.

In the autonomous vehicle context, thermal management of electronic and compute components and systems in ADSCs is particularly challenging as electronic and compute components are vulnerable to, and generally ill-suited to handle, the harsh and extreme weather, temperature, operational, and environmental conditions experienced by autonomous vehicles. Indeed, the electronic and compute components available can succumb to the harsh and extreme conditions experienced in the operational domain of autonomous vehicles. What is needed in the art is thermal management technologies that enable ADSCs and internal ADSC components to manage and withstand the difficult conditions experienced in the operational domain of autonomous vehicles.

BRIEF DESCRIPTION OF THE DRAWINGS

The various advantages and features of the present technology will become apparent by reference to specific implementations illustrated in the appended drawings. A person of ordinary skill in the art will understand that these drawings only show some examples of the present technology and would not limit the scope of the present technology to these examples. Furthermore, the skilled artisan will appreciate the principles of the present technology as described and explained with additional specificity and detail through the use of the accompanying drawings in which:

FIG. 6 is a flowchart of an example method for thermal management in autonomous driving super computers using a two-phase cooling system, in accordance with some examples.

DETAILED DESCRIPTION

Figure 1:
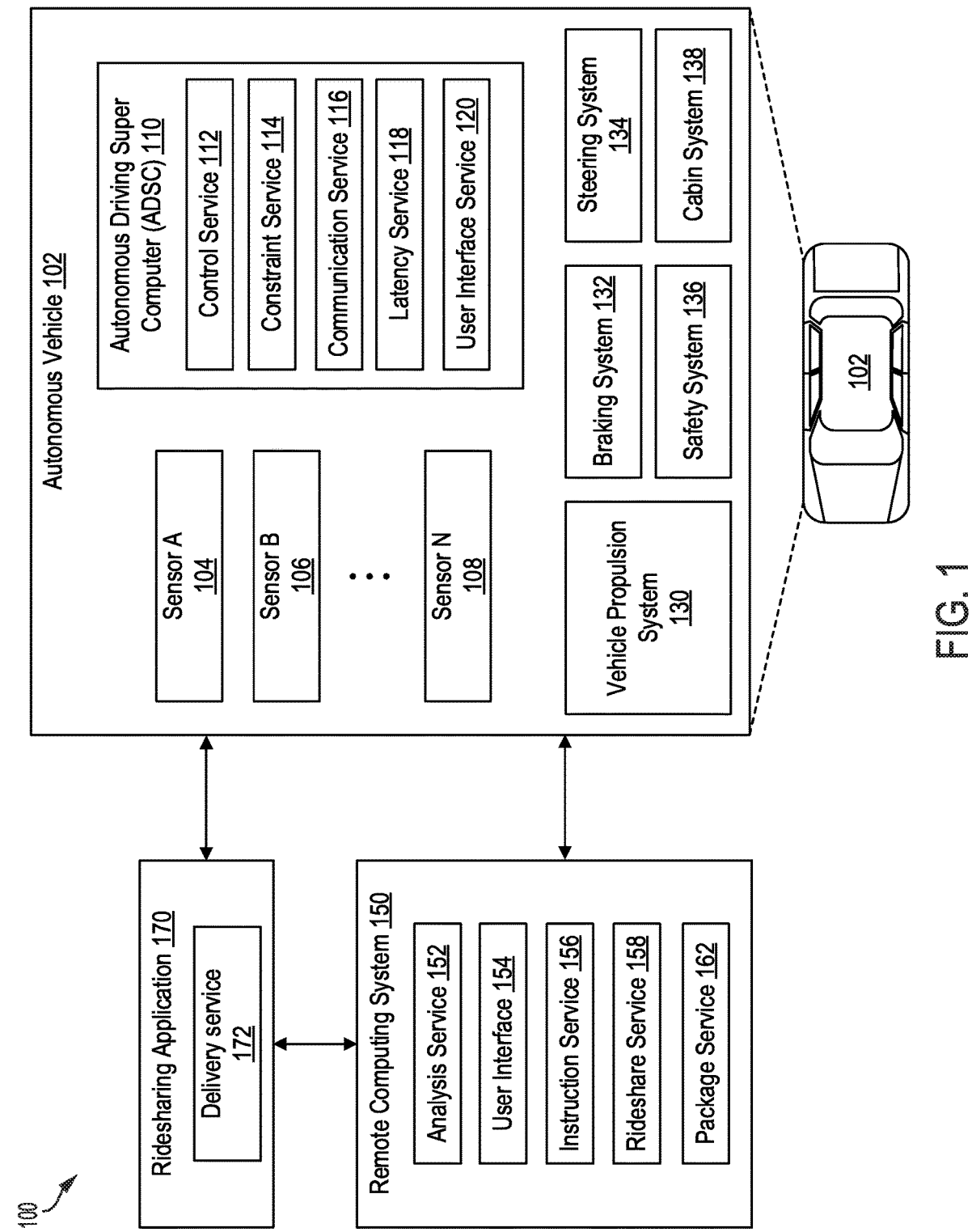
FIG. 1 illustrates an example autonomous vehicle environment including a computing system in communication with an autonomous vehicle, in accordance with some examples.

Various examples of the present technology are discussed in detail below. While specific implementations are discussed, it should be understood that this is done for illustration purposes only. A person skilled in the relevant art will recognize that other components and configurations may be used without parting from the spirit and scope of the present technology. In some instances, well-known structures and devices are shown in block diagram form in order to facilitate describing one or more aspects. Further, it is to be understood that functionality that is described as being carried out by certain system components may be performed by more or fewer components than shown.

The disclosed technologies address a need in the art for improved thermal management strategies for autonomous driving super computers (ADSCs) and ADSC compute and electronic components. As previously explained, autonomous vehicles and ADSCs can experience a variety of harsh and often hazardous conditions, such as extreme temperatures, extreme temperature fluctuations, weather elements (e.g., wind, rain, snow, ice, humidity, etc.), harmful environmental particles or matter (e.g., dust, dirt, grease, etc.), damaging forces (e.g., shock, vibrations, impacts, collisions, etc.), water, rough terrains, and other harsh or hazardous environmental and operating conditions. As a result, thermal management of electronic and compute components in ADSCs can be very challenging as electronic and compute components are vulnerable to, and generally ill-suited to handle, the harsh and extreme weather, operational, and temperature conditions experienced by autonomous vehicles.

This is further exacerbated by the increasing processing speeds, capacity and functionality, and power density of ADSCs, which produce more heat than other computing systems and servers as well as prior generations of ADSCs, and a trend towards smaller ADSC form factors which result in more powerful ADSC components and higher amounts of heat contained within a smaller amount of space. As such, the higher operating temperatures of ADSCs can rapidly surpass the cooling capabilities of thermal management systems. Moreover, while implementing bigger, more powerful cooling components can, to a certain degree, increase the cooling performance of a thermal management system, the size and power constraints of ADSCs can limit to size and power of the cooling components implemented in thermal management systems. Thus, simply increasing the size and power of cooling components is generally not sufficient for adequate thermal management performance and often not an option.

For example, implementing a bigger, more powerful pump for increasing a flow rate of coolant circulated in a thermal management system can help increase the cooling performance of the thermal management system. However, the size and power constraints of the ADSC can impose size and power constraints/limits on the pumps implemented by the thermal management system. Moreover, the performance benefits of higher flow rates can reach a peak as a drop in the flow pressure across the thermal management system can eventually negate further performance benefits from increased pumping power.

The technologies herein can provide thermal management systems and strategies that can help ADSCs and internal ADSC components (e.g., internal electronic and compute components) handle and withstand the difficult conditions experienced in the operational domain of autonomous vehicles, without exceeding or increasing the size and power requirements of the ADSC and internal ADSC components. In some examples, the technologies herein can implement two-phase cooling systems in ADSCs. The two-phase cooling systems can be designed to provide enhanced thermal management benefits to internal components in the ADSCs and allow the internal components to handle and withstand harsh and extreme weather, temperature, and other conditions experienced by ADSCs. The two-phase cooling systems herein can allow the ADSC's to maintain a smaller size with lower power requirements to accommodate the size constraints of autonomous vehicles and the power-constraints of electric vehicles.

Figure 7:
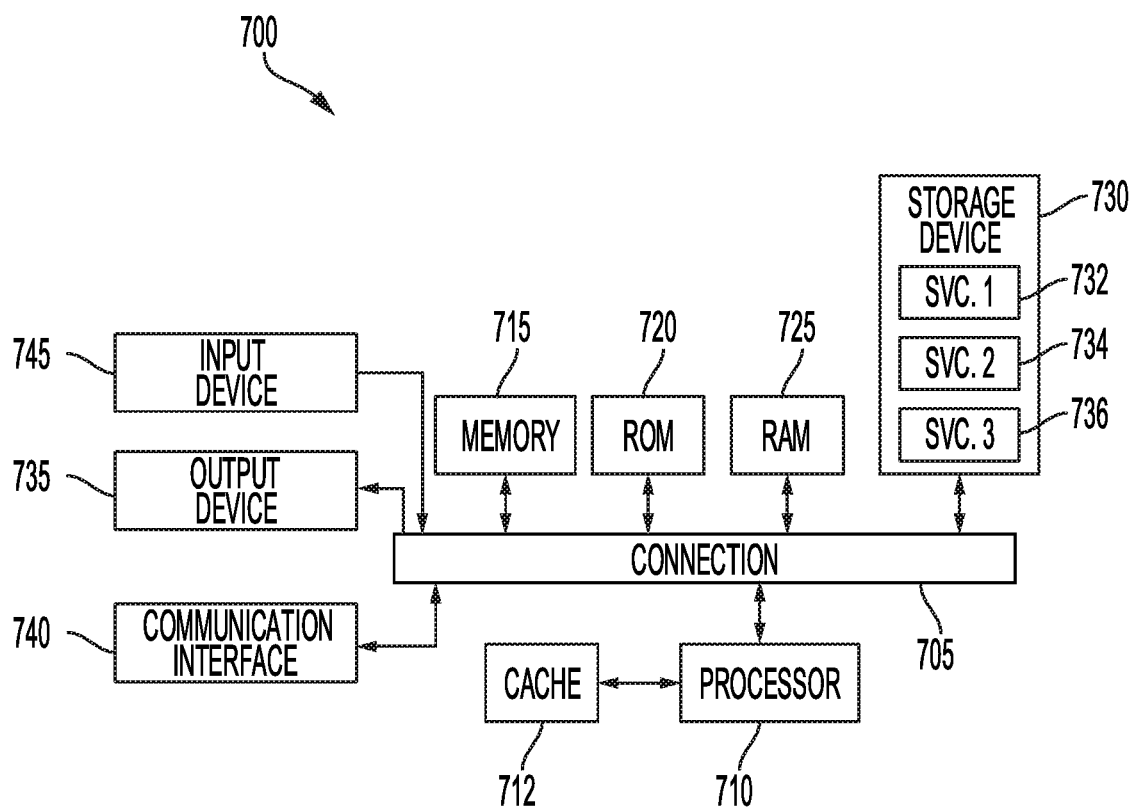
FIG. 7 illustrates an example computing system architecture for implementing various aspects of the present technology.

In the following disclosure, systems and methods are provided for two-phase cooling systems for ADSCs and associated compute and electronic components. The present technologies will be described in the following disclosure as follows. The discussion begins with a description of example autonomous vehicle environments and systems, technologies and techniques for two-phase cooling systems and thermal management of ADSCs and ADSC internal components, as illustrated in FIGS. 1 through 5B. A description of an example method implementing two-phase cooling systems for thermal management of ADSCs and ADSC internal components, as illustrated in FIG. 6, will then follow. The discussion concludes with a description of an example computing device architecture, including example hardware components that can be implemented in ADSCs, as illustrated in FIG. 7. The disclosure now turns to FIG. 1.

FIG. 1 illustrates an example autonomous vehicle environment 100. The example autonomous vehicle environment 100 includes an autonomous vehicle 102, a remote computing system 150, and a ridesharing application 170. The autonomous vehicle 102, remote computing system 150, and ridesharing application 170 can communicate with each other over one or more networks, such as a public network (e.g., a public cloud, the Internet, etc.), a private network (e.g., a local area network, a private cloud, a virtual private network, etc.), and/or a hybrid network (e.g., a multi-cloud or hybrid cloud network, etc.).

The autonomous vehicle 102 can navigate about roadways without a human driver based on sensor signals generated by sensors 104-108 on the autonomous vehicle 102. The sensors 104-108 on the autonomous vehicle 102 can include one or more types of sensors and can be arranged about the autonomous vehicle 102. For example, the sensors 104-108 can include, without limitation, one or more inertial measuring units (IMUs), one or more image sensors (e.g., visible light image sensors, infrared image sensors, video camera sensors, surround view camera sensors, etc.), one or more light emitting sensors, one or more global positioning system (GPS) devices, one or more radars, one or more light detection and ranging sensors (LIDARs), one or more sonars, one or more accelerometers, one or more gyroscopes, one or more magnetometers, one or more altimeters, one or more tilt sensors, one or more motion detection sensors, one or more light sensors, one or more audio sensors, etc. In some implementations, sensor 104 can be a radar, sensor 106 can be a first image sensor (e.g., a visible light camera), and sensor 108 can be a second image sensor (e.g., a thermal camera). Other implementations can include any other number and type of sensors.

The autonomous vehicle 102 can include several mechanical systems that are used to effectuate motion of the autonomous vehicle 102. For instance, the mechanical systems can include, but are not limited to, a vehicle propulsion system 130, a braking system 132, and a steering system 134. The vehicle propulsion system 130 can include an electric motor, an internal combustion engine, or both. The braking system 132 can include an engine brake, brake pads, actuators, and/or any other suitable componentry configured to assist in decelerating the autonomous vehicle 102. The steering system 134 includes suitable componentry configured to control the direction of movement of the autonomous vehicle 102 during navigation.

The autonomous vehicle 102 can include a safety system 136. The safety system 136 can include lights and signal indicators, a parking brake, airbags, etc. The autonomous vehicle 102 can also include a cabin system 138, which can include cabin temperature control systems, in-cabin entertainment systems, etc.

The autonomous vehicle 102 can include an autonomous driving super computer (ADSC) 110 in communication with the sensors 104-108 and the systems 130, 132, 134, 136, and 138. The ADSC 110 can include one or more internal computers and/or computing systems. Moreover, the ADSC 110 can include one or more compute components or processors such as, for example, one or more central processing units (CPUs), one or more graphics processing units (GPUs), one or more digital signal processors (DSPs), one or more image signal processors (ISPs), one or more Intellectual Property (IP) cores, one or more microprocessors, etc. The ADSC 110 can also include one or more hardware components and/or electronic circuits such as, for example, one or more field-programmable gate arrays (FPGAs), one or more application-specific integrated circuits (ASICs), one or more storage devices, one or more memory devices, one or more communications devices (e.g., network interface card (NIC), wireless NIC, antenna, etc.), one or more sensors (e.g., image or camera sensor, radar sensor, LIDAR sensor, etc.), one or more GPS devices, etc.

In some examples, the ADSC 110 includes one or more processors and at least one memory for storing instructions executable by the one or more processors. The computer-executable instructions can make up one or more services for controlling the autonomous vehicle 102, communicating with remote computing system 150, receiving inputs from passengers or human co-pilots, logging metrics regarding data collected by sensors 104-108 and human co-pilots, etc.

In some cases, the ADSC 110 can include a control service 112 configured to control operation of the vehicle propulsion system 130, the braking system 132, the steering system 134, the safety system 136, and the cabin system 138. The control service 112 can receive sensor signals from the sensors 104-108 can communicate with other services of the ADSC 110 to effectuate operation of the autonomous vehicle 102. In some examples, control service 112 may carry out operations in concert with one or more other systems of autonomous vehicle 102.

In some cases, the ADSC 110 can also include a constraint service 114 to facilitate safe propulsion of the autonomous vehicle 102. The constraint service 116 includes instructions for activating a constraint based on a rule-based restriction upon operation of the autonomous vehicle 102. For example, the constraint may be a restriction on navigation that is activated in accordance with protocols configured to avoid occupying the same space as other objects, abide by traffic laws, circumvent avoidance areas, etc. In some examples, the constraint service 114 can be part of the control service 112.

The ADSC 110 can also include a communication service 116. The communication service 116 can include software and/or hardware elements for transmitting and receiving signals to and from the remote computing system 150. The communication service 116 can be configured to transmit information wirelessly over a network, for example, through an antenna array or interface that provides cellular (long-term evolution (LTE), $3^{rd}$ Generation (3G), $5^{th}$ Generation (5G), etc.) communication.

In some examples, one or more services of the ADSC 110 are configured to send and receive communications to remote computing system 150 for reporting data for training and evaluating machine learning algorithms, requesting assistance from remote computing system 150 or a human operator via remote computing system 150, software service updates, ridesharing data, etc.

The ADSC 110 can also include a latency service 118. The latency service 118 can utilize timestamps on communications to and from the remote computing system 150 to determine if a communication has been received from the remote computing system 150 in time to be useful. For example, when a service of the ADSC 110 requests feedback from remote computing system 150 on a time-sensitive process, the latency service 118 can determine if a response was timely received from remote computing system 150, as information can quickly become too stale to be actionable. When the latency service 118 determines that a response has not been received within a threshold period of time, the latency service 118 can enable other systems of autonomous vehicle 102 or a passenger to make decisions or provide needed feedback.

The ADSC 110 can also include a user interface service 120 that can communicate with cabin system 138 to provide information or receive information to a human co-pilot or passenger. In some examples, a human co-pilot or passenger can be asked or requested to evaluate and override a constraint from constraint service 114. In other examples, the human co-pilot or passenger may wish to provide an instruction to the autonomous vehicle 102 regarding destinations, requested routes, or other requested operations.

As described above, the remote computing system 150 can be configured to send and receive signals to and from the autonomous vehicle 102. The signals can include, for example and without limitation, data reported for training and evaluating services such as machine learning services, data for requesting assistance from remote computing system 150 or a human operator, software service updates, rideshare data, commands or instructions, statistics, navigation data, vehicle data, etc.

The remote computing system 150 can include an analysis service 152 configured to receive data from autonomous vehicle 102 and analyze the data to train or evaluate machine learning algorithms for operating the autonomous vehicle 102. The analysis service 152 can also perform analysis pertaining to data associated with one or more errors or constraints reported by autonomous vehicle 102.

The remote computing system 150 can also include a user interface service 154 configured to present metrics, video, images, sounds reported from the autonomous vehicle 102 to an operator of remote computing system 150, maps, routes, navigation data, notifications, user data, vehicle data, software data, and/or any other content. User interface service 154 can receive, from an operator, input instructions for the autonomous vehicle 102.

The remote computing system 150 can also include an instruction service 156 for sending instructions regarding the operation of the autonomous vehicle 102. For example, in response to an output of the analysis service 152 or user interface service 154, instructions service 156 can prepare instructions to one or more services of the autonomous vehicle 102 or a co-pilot or passenger of the autonomous vehicle 102.

The remote computing system 150 can also include a rideshare service 158 configured to interact with ridesharing applications 170 operating on computing devices, such as tablet computers, laptop computers, smartphones, head-mounted displays (HMDs), gaming systems, servers, smart devices, smart wearables, and/or any other computing devices. In some cases, such computing devices can be passenger computing devices. The rideshare service 158 can receive from passenger ridesharing app 170 requests, such as user requests to be picked up or dropped off, and can dispatch autonomous vehicle 102 for a requested trip.

The rideshare service 158 can also act as an intermediary between the ridesharing app 170 and the autonomous vehicle 102. For example, rideshare service 158 can receive from a passenger instructions for the autonomous vehicle 102, such as instructions to go around an obstacle, change routes, honk the horn, etc. The rideshare service 158 can provide such instructions to the autonomous vehicle 102 as requested.

The remote computing system 150 can also include a package service 162 configured to interact with the ridesharing application 170 and/or a delivery service 172 of the ridesharing application 170. A user operating ridesharing application 170 can interact with the delivery service 172 to specify information regarding a package to be delivered using the autonomous vehicle 102. The specified information can include, for example and without limitation, package dimensions, a package weight, a destination address, delivery instructions (e.g., a delivery time, a delivery note, a delivery constraint, etc.), and so forth.

The package service 162 can interact with the delivery service 172 to provide a package identifier to the user for package labeling and tracking. Package delivery service 172 can also inform a user of where to bring their labeled package for drop off. In some examples, a user can request the autonomous vehicle 102 come to a specific location, such as the user's location, to pick up the package. While delivery service 172 has been shown as part of the ridesharing application 170, it will be appreciated by those of ordinary skill in the art that delivery service 172 can be its own separate application.

One beneficial aspect of utilizing autonomous vehicle 102 for both ridesharing and package delivery is increased utilization of the autonomous vehicle 102. Instruction service 156 can continuously keep the autonomous vehicle 102 engaged in a productive itinerary between rideshare trips by filling what otherwise would have been idle time with productive package delivery trips.

Figure 2A:
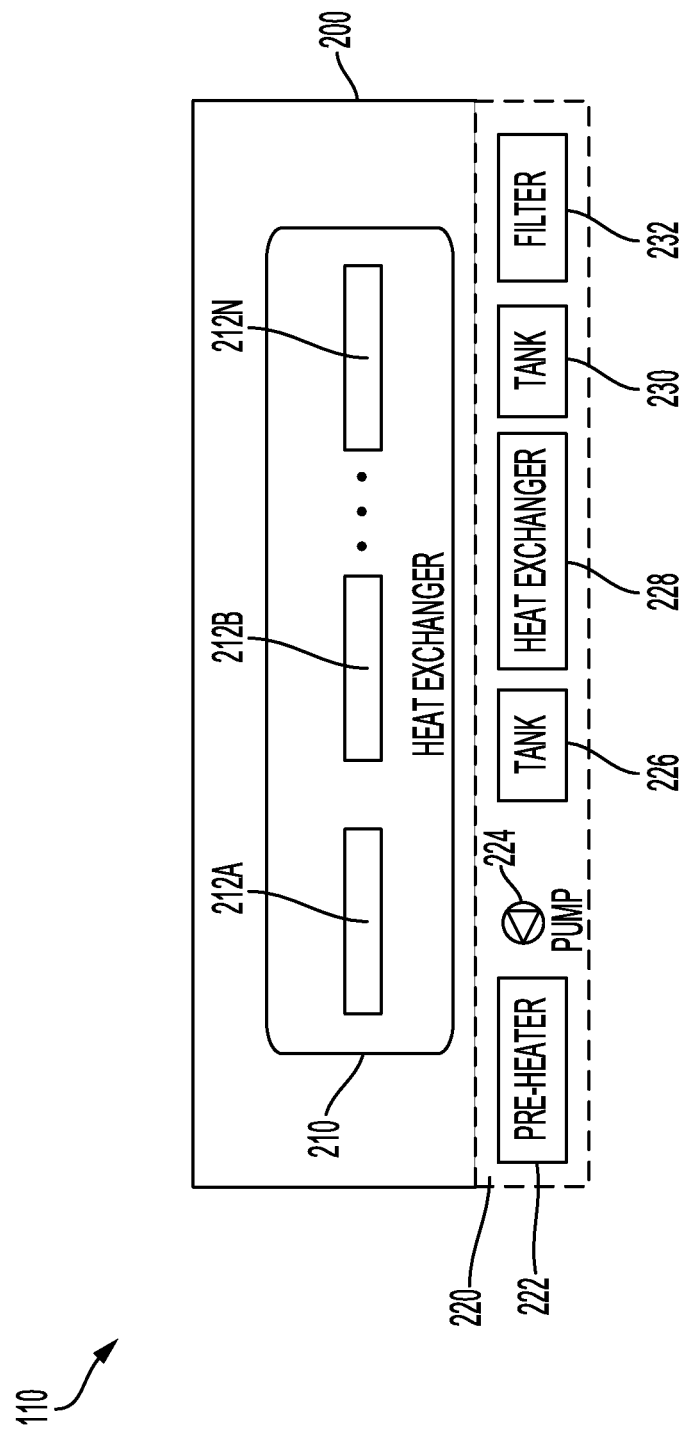
FIGS. 2A and 2B are schematic diagrams illustrating example configurations of an autonomous driving super computer, in accordance with some examples.

FIG. 2A is a schematic diagram illustrating an example configuration of ADSC 110. In this example, the ADSC 110 includes a chassis 200 for housing, stabilizing and protecting internal components of the ADSC 110. In some cases, the chassis 200 can be a rugged enclosure designed for durability and the capacity to withstand extended use in harsh and/or unpredictable environments. For example, autonomous vehicles and the internal components of autonomous vehicles can experience a variety of environmental and operational conditions such as, for example, extreme temperatures (e.g., extreme cold and hot temperatures), temperature fluctuations, wind, water and humidity, dust, dirt, grease, snow, ice, vibrations, shock, impacts, collisions, rough terrains, and other hazards and conditions. Thus, the chassis 200 can be designed to stabilize the internal components of the ADSC 110 and protect them from such harsh conditions and environments.

The chassis 200 can house and stabilize computing components 212A-N (collectively "212") of the ADSC 110 and an evaporative heat exchanger 210 used to provide thermal management for the computing components 212. In some examples, the chassis 200 can also house one or more power electronics components, such as a power supply, for supplying power to the computing components 212. In other examples, the computing components 212 in the ADSC 110 can receive power from one or more power electronics components residing outside of the chassis 200 on one or more locations in the autonomous vehicle 102. In some cases, the chassis 200 can house and stabilize one or more other computing, power, and/or thermal management components. For example, the chassis 200 can house and stabilize one or more components in the two-phase cooling loop described below with respect to FIGS. 3 and 4A through 4E.

In some examples, all of the computing components 212 can be directly or indirectly mounted or coupled to the evaporative heat exchanger 210. In other examples, some or all of the computing components 212 can be mounted on, or coupled to, one or more structures and/or boards, such as printed circuit boards (PCBs) or motherboards, which can be directly or indirectly coupled to or mounted on the evaporative heat exchanger 210. The computing components 212 can include, for example and without limitation, one or more storage devices, one or more CPUs, one or more GPUs, one or more DSPs, one or more ISPs, one or more FPGAs, one or more ASICs, one or more controllers, one or more power electronics, one or more sensors, one or more memory devices (e.g., RAM, ROM, cache, and/or the like), one or more network interfaces (e.g., wired and/or wireless communication interfaces and the like), and/or other electronic circuits or hardware, processing devices, computer software, firmware, or any combination thereof.

In some examples, the chassis 200 can include or can be coupled to a housing area 220 for housing other components of the ADSC 110 and/or the thermal management system described herein. For example, the chassis 200 can include or can be coupled to a housing area 220 housing a pre-heater 222 used to heat a flow (e.g., fluid, gas/vapor, a two-phase mixture of fluid and gas/vapor, etc.) in a flow channel that provides thermal management as further described below and/or used to trigger a phase change of the flow in the flow channel, a pump 224 for circulating a flow in the flow channel, an overflow tank 226 to hold overflow fluid and/or gas/vapor from the flow channel and accommodate volume during phase changes, a condensing heat exchanger 228 for transferring heat and condensing vapor in the flow channel, a surge tank 230 that depending on the operating environment can be implemented to serve not only as an accumulator but also a pressure regulator, and a filter 232 that can be implemented to filter components of a flow before entering the pump 224. In some cases, the chassis 200 and/or housing area 220 can house all of the pre-heater 222, the pump 224, the overflow tank 226, the condensing heat exchanger 228, the surge tank 230, and the filter 232. In other cases, the chassis 200 and/or housing area 220 can house some or none of the pre-heater 222, the pump 224, the overflow tank 226, the condensing heat exchanger 228, the surge tank 230, and the filter 232.

For example, in some cases, the pre-heater 222, the pump 224, the overflow tank 226, the condensing heat exchanger 228, the surge tank 230, and/or the filter 232 can be housed by housing area 220 and/or the chassis 200. In other cases, the pre-heater 222, the pump 224, the overflow tank 226, the condensing heat exchanger 228, the surge tank 230, and/or the filter 232 can reside outside of the chassis 200 and/or housing area 220 at one or more locations on the autonomous vehicle 102. In some cases, some or all of the housing area 220 can be internal to, or within, the chassis 200, and in other cases some or all of the housing area 220 can be external to the chassis 200.

In some examples, the one or more evaporative heat exchangers 210 can include any heat exchangers with evaporation capabilities such as a phase-change or two-phase heat exchanger that can heat a liquid to boil or evaporate it. In some cases, the one or more evaporative heat exchangers 210 can include or implement, for example and without limitation, one or more heat pipes, one or more vapor chambers, one or more fans, one or more microchannels or tubes, one or more air channels, one or more heat sinks, one or more heat spreaders, one or more wicks, one or more plates, one or more walls or structures, and/or one or more thermal management components or features. In some examples, the one or more evaporative heat exchangers 210 can include a cold plate. In other examples, the one or more evaporative heat exchangers 210 can include multiple cold plates. For example, in some cases, the chassis 200 can house a series, stack, cluster, or set of layers of cold plates used as evaporative heat exchangers to provide thermal management for the computing components 212.

Moreover, the size and number of evaporative heat exchangers 210 implemented for the ADSC 110 can vary based on one or more factors such as, for example, thermal management requirements, number and/or type of electronic components (e.g., computing components 212, etc.) in the ADSC 110, power requirements associated with the ADSC 110, size and/or shape of the ADSC 110, type and/or characteristics of the autonomous vehicle 102 where the ADSC 110 is deployed, performance requirements associated with the ADSC 110, space considerations, environmental factors, operational conditions, and/or any other factors that can impact the power, thermal, space, performance, and/or configuration requirements associated with the ADSC 110.

In some examples, the chassis 200 can house one or more additional components such as, for example and without limitation, one or more fans, one or more heat sinks, one or more heat spreaders, one or more heat exchangers, one or more thermal management components or features, one or more cables or wires, one or more interfaces, one or more control systems, other electronic circuits, other electronic hardware, tubing/pipes, a flow channel as further described herein, a two-phase cooling loop as described herein, etc. An illustrative example of computing device and hardware components that can be implemented by the ADSC 110 and housed by the chassis 200 are described below with respect to FIG. 7.

Figure 2B:
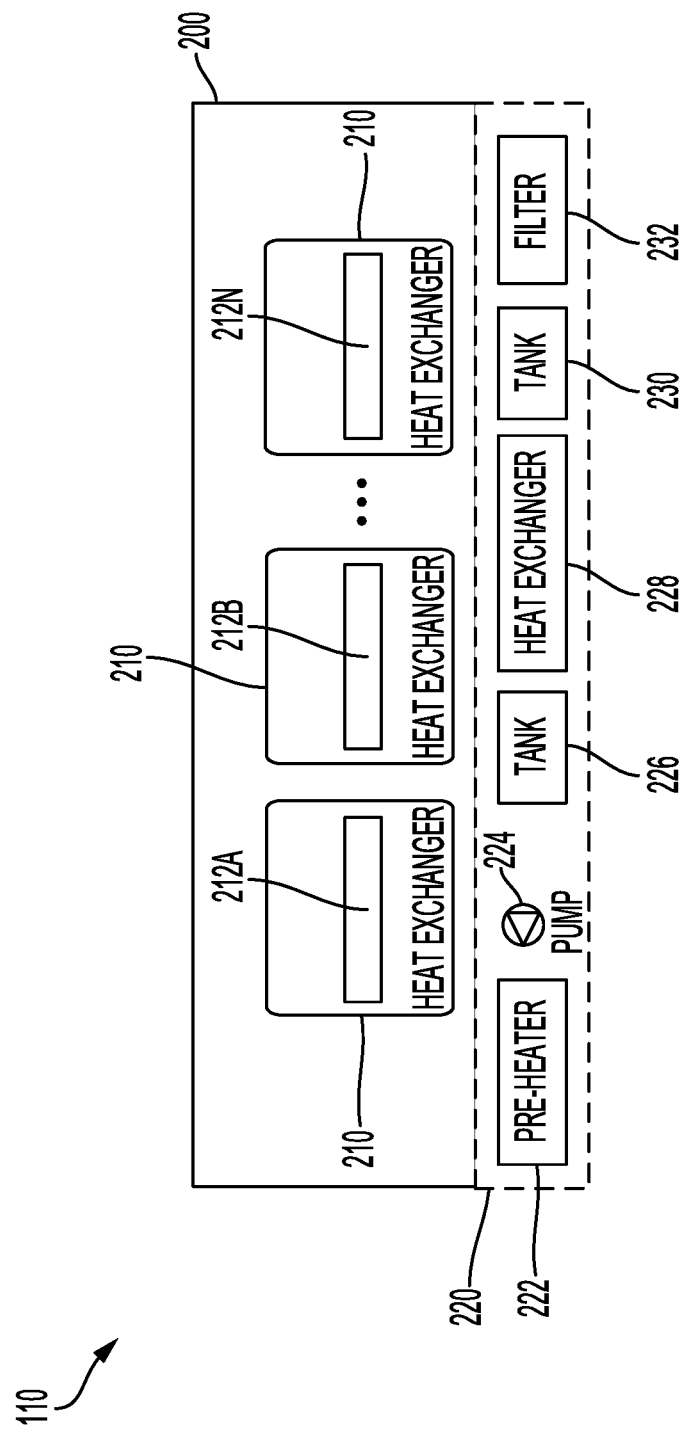

With reference to FIG. 2B, in some examples, the chassis 200 can include multiple evaporative heat exchangers 210. In some cases, each of the evaporative heat exchangers 210 can be directly or indirectly coupled to one or more of the computing components 212. For example, each of the evaporative heat exchangers 210 can have one or more computing components mounted directly or indirectly on that evaporative heat exchanger. In other cases, the computing components 212 can be mounted on, or coupled to, one or more structures and/or boards that can be directly or indirectly coupled to or mounted on the evaporative heat exchangers 210.

While the ADSC 110 shown in FIGS. 2A and 2B includes certain components, one of ordinary skill will appreciate that the ADSC 110 can include more or fewer components than those shown in FIGS. 2A and 2B. The components and arrangement of components shown in FIGS. 2A and 2B are provided as illustrative examples for clarity and explanation purposes.

Figure 3:
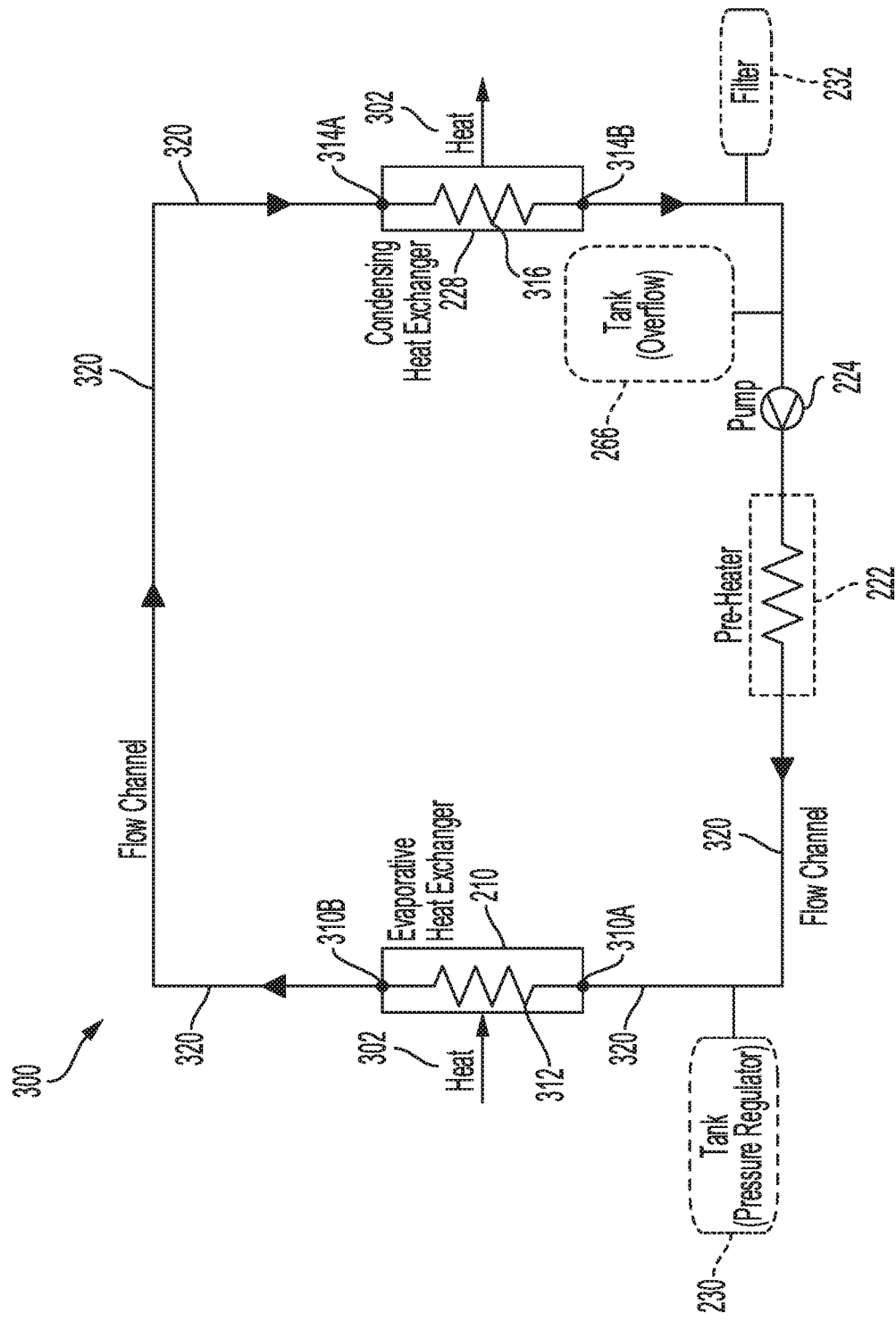
FIG. 3 is a schematic diagram illustrating an example configuration of a two-phase cooling loop for thermal management, in accordance with some examples.

FIG. 3 is a schematic diagram illustrating an example configuration of a two-phase cooling loop 300 for thermal management. The two-phase cooling loop 300 can be implemented to provide thermal management for the ADSC 110 and associated components. As further explained herein, the two-phase cooling loop 300 can achieve high heat transfer coefficients at lower flow rates and pumping power. Moreover, the two-phase cooling loop 300 can achieve high thermal management performance in ADSCs with smaller form factors, without increasing or exceeding the size constraints of such ADSCs.

The two-phase cooling loop 300 can include a flow channel 320 for carrying a flow (e.g., fluid, gas/vapor, and/or a two-phase mixture) to remove, transfer, and/or dissipate heat away from computing components (e.g., 212) in the ADSC 110. The flow channel 320 can form a closed-loop channel containing a working fluid that circulates through the flow channel 320. Moreover, the flow channel 320 can have a flow of fluid in some areas/sections, and a flow of gas/vapor or a two-phase mixture (e.g., fluid and vapor/gas) in other areas/sections, as further described herein. For example, the flow channel 320 can have a single-phase fluid circulating in some areas/sections and a flow of gas/vapor or a two-phase mixture of gas/vapor and fluid in other areas/sections.

In some cases, the flow channel 320 can be designed to be compatible with the working fluid used in the flow channel 320. Moreover, in some cases, the material(s) used to construct the flow channel 320 can be selected based one or more environmental, operational, performance, and/or surrounding factors or conditions. Non-limiting example materials that can be used for the flow channel 320 can include copper, aluminum, superalloys, and/or any other materials.

In some examples, the configuration (e.g., size, length, shape, thickness, structure, etc.) of the flow channel 320 can vary based on one or more factors such as, for example, the type of working fluid, the characteristics (e.g., layout, size, shape, materials, etc.) of the two-phase cooling loop 300, the layout of the computing components 212, the desired heat carrying capacity of the flow channel 320, the type and/or number of computing components 212, the environmental and operating conditions of the flow channel 320, performance requirements or factors associated with the computing components 212, a desired maximum power handling or heat carrying capacity (Qmax) of the flow channel 320, and/or any other constraints that can influence the performance, stability, cost, etc., of the flow channel 320.

In some examples, the flow channel 320 can include one or more internal structures and/or features. For example, the flow channel 320 can include one or more microchannels, one or more wick structures, one or more tubes, one or more plates, and/or any other internal structure. In some cases, the configuration of the case (outer portion or wall) of the flow channel 320 and/or one or more internal structures of the flow channel 320 can depend on any constrains created by the characteristics of the flow channel 320, the layout of the computing components 212, the desired maximum power handling or heat carrying capacity (Qmax) of the flow channel 320, the working fluid of the flow channel 320, the environmental and operating conditions of the flow channel 320, and/or any other factors.

The type of fluid implemented in the flow channel 320 can vary based on one or more factors and/or considerations. As previously mentioned, in the context of autonomous vehicles (e.g., 102), the environmental conditions and the conditions surrounding the ADSC 110 can vary and are often harsh or extreme. Thus, the properties of the fluid implemented with the flow channel 320 can affect the performance of the fluid in the flow channel 320 and the two-phase cooling loop 300. For example, depending on various environmental, operational, and surrounding factors and conditions, certain fluids can lead to poor heat transfer, clogging, corrosion, poor phase transfer or inability to change phases, low flow rates, inability to sustain a certain phase, and/or even system failure, while other fluids may have better heat transfer performance, may not clog, may limit or avoid corrosion, may provide better phase-transfer performance under various conditions, may result in better flow rates under certain conditions, may be better able to maintain a certain phase under various conditions, and/or may reduce the likelihood of system failure.

Accordingly, the type of fluid implemented in the flow channel 320 can be selected based on the properties of the fluid and the environmental, operational, and surrounding conditions in which the fluid will operate. For example, the fluid can be selected based on the properties of the fluid and the temperature in which the two-phase cooling loop 300 will operate. Non-limiting examples of factors of a fluid that can be considered when selecting a fluid can include the fluid's compatibility with the system's materials (e.g., metals, substrates, electronics, etc.) and/or the flow channel 320, the fluid's thermal conductivity and specific heat, the fluid's viscosity, the fluid's freezing point, the fluid's flash point, the fluid's corrosivity, the fluid's toxicity, the fluid's thermal stability, the temperature range supported by the fluid, etc.

In some examples, the type of fluid selected can be a fluid determined to have compatibility with the system's materials and/or the flow channel 320, high thermal conductivity and specific heat, low viscosity, a low freezing point, a certain flash point, low corrosivity, low toxicity, and/or thermal stability. In some examples, the fluid used in the fluid channel 320 can be water with or without some amount of refrigerant. In some examples, the fluid used in the fluid channel 320 can be glycol or R25 refrigerant. Moreover, non-limiting examples of other fluids can include de-ionized water, dielectric fluids, alcohol (e.g., methanol, ethanol, etc.), mercury, ammonia, water/glycol, Freon, alkali metals (e.g., cesium, potassium, sodium), refrigerant R134a, refrigerant R25, refrigerant 245fa, refrigerant 410A, a mix of fluids, etc.

In some examples, the two-phase cooling loop 300 can include an evaporative heat exchanger 210, such as a cold plate, that can convert a working fluid into gas/vapor or a two-phase flow of gas/vapor and liquid. The evaporative heat exchanger 210 can provide heat transfer or dissipation to transfer heat from one location to another. For example, the evaporative heat exchanger 210 can provide heat transfer or dissipation to transfer heat away from the computing components 212. In some examples, the evaporative heat exchanger 210 can include an inlet 310A for receiving a working fluid (e.g., liquid coolant) from the fluid channel 320. In some cases, the working fluid can enter the evaporative heat exchanger 210 through the inlet 310A as a single-phase liquid. The fluid can be boiled or evaporated as it flows through the evaporative heat exchanger 210. The evaporative heat exchanger 210 can convert heat 302 generated by a heat source, such as components (e.g., 212) in the ADSC 110, into latent heat and transfer such heat away by vapor flow or a flow of a two-phase mixture, such as a liquid-vapor flow. The working fluid can then exit the evaporative heat exchanger 210 at an outlet 310B as a vapor flow or a two-phase mixture. The flow channel 320 can continue to circulate the vapor flow or two-phase mixture towards a condensing heat exchanger 228 in the two-phase cooling loop 300.

In some examples, the evaporative heat exchanger 210 can be directly or indirectly coupled to one or more electronics and/or computing components (e.g., 212) in the ADSC 110. The evaporative heat exchanger 210 can collect or absorb heat 302 from the one or more electronics and/or computing components (e.g., 212) in the ADSC 110 and transfer the heat 302 away from them. By transferring the heat 302 away from the electronics and/or computing components, the evaporative heat exchanger 210 can maintain a temperature of the ADSC 110 within a certain desired range and/or reduce the temperature of the ADSC 110, thereby providing cooling and thermal management benefits to the ADSC 110.

After the vapor flow or two-phase mixture exits the evaporative heat exchanger 210, it can flow through the flow channel 320 until it reaches an inlet 314A of a condensing heat exchanger 228. The condensing heat exchanger 228 can condense the vapor or two-phase mixture into a liquid phase and can cause heat 302 from the fluid and/or vapor to be released to the ambient, a heat sink, and/or to the autonomous vehicle 102. For example, in some cases, the heat 302 from the fluid and/or vapor in the condensing heat exchanger 228 can be released to a refrigeration loop or channel of an air conditioning system on the autonomous vehicle 102. This way, the evaporative heat exchanger 210 can transfer heat away from the ADSC 110 and thereby provide cooling and thermal management benefits for the ADSC 110.

In some cases, the evaporative heat exchanger 210 and/or the condensing heat exchanger 228 can include two-phase or phase-change heat exchangers. Moreover, in some examples, the evaporative heat exchanger 210 and/or the condensing heat exchanger 228 can include one or more internal structures such as, for example, one or more wicks, one or more microchannels, one or more walls, one or more plates, one or more tubes, etc.

After the vapor or two-phase mixture in the condensing heat exchanger 228 is condensed into a fluid, the fluid can exit the condensing heat exchanger 228 back into the flow channel 320 through an outlet 314B of the condensing heat exchanger 228. In some cases, the output of the condensing heat exchanger 228 at the outlet 314B can also include vapor. For example, the output of the condensing heat exchanger 228 at the outlet 314B can include a two-phase mixture of fluid and vapor. In some cases, the flow channel 320 can include a filter 232 to filter components of the flow (e.g., fluid, vapor, particles, etc.) prior to the flow entering the pump 224.

A tank 226 connected to the flow channel 320 can serve as an overflow reservoir for the flow (e.g., fluid or two-phase mixture of fluid and vapor) circulating in the flow channel 320 after exiting the outlet 314B of the condensing heat exchanger 228. The tank 226 can accommodate for the volume of the flow from the phase changes. In some examples, the tank 226 can help control or adjust the pressure of the flow circulating in the flow channel 320. For example, the tank 226 can be configured to expand and hold more fluid as the pressure of the flow increases, and compress as the pressure of the flow decreases. The expansion and compression of the tank 226 can help control the pressure of the flow in the flow channel 320. In some examples, the tank 226 can be pressure controlled. In other examples, the tank 226 can be heat controlled.

Controlling the pressure of the flow in the flow channel 320 can be advantageous for various reasons. For example, controlling the pressure of the flow can help the two-phase cooling loop 300 maintain a desired flow rate or range of flow rates. The flow rate of the flow can impact the cooling and thermal management performance of the two-phase cooling loop 300. To illustrate, a higher flow rate can allow more heat to be transferred and/or released by the flow, thus providing better cooling and thermal management for the ADSC 110. However, higher flow rates may require bigger, more power-hungry pumps to increase or maintain the flow rate across the two-phase cooling loop 300. In environments that have power and space constraints, as is often the case with ADSCs in electric autonomous vehicles, this can present several challenges and/or limitations. Moreover, in some cases, the cooling performance gains from higher flow rates generated by bigger, more powerful pumps can peak or reach a point of diminishing returns, as the pressure drop across the flow channel 320 can negate or limit the cooling performance gains from the higher flow rates generated. Thus, the ability of the tank 226 to control or balance the pressure of the fluid in the flow channel 320 can provide various advantages.

A pump 224 can receive the flow from the condensing heat exchanger 228 and circulate the flow downstream the flow channel 320. In some examples, the pump 224 can increase the pressure of the flow to increase the flow rate across some or all of the flow channel 320. In some cases, the pump 224 can be a two-phase pump capable of pumping a single-phase liquid or a two-phase mixture of liquid and vapor. Moreover, in some examples, the pump 224 can be a battery-powered pump.

As previously noted, the cooling performance gains from higher flow rates generated by bigger, more powerful pumps can have a limit. Thus, in some examples, the pump 224 can be designed to balance space and power constraints of the ADSC 110 and autonomous vehicle 102, performance benefits of higher flow rates, and flow rate (and associated performance) limitations across the flow channel 320.

The flow circulated by the pump 224 can circulate to the evaporative heat exchanger 210, entering the evaporative heat exchanger 210 at the inlet 310A and undergoing another cycle through the evaporative heat exchanger 210 and the two-phase cooling loop 300 as previously explained. In some cases, the two-phase cooling loop 300 can optionally include a pre-heater 222, which can process the flow circulated by the pump 224 before it reaches the evaporative heat exchanger 210. For example, a pre-heater 222 can be implemented downstream the pump 222 in the two-phase cooling loop 300. The flow circulated by the pump 224 can thus flow to the pre-heater 222 before reaching the evaporative heat exchanger 210.

The pre-heater 222 can heat flow in the flow channel 320 before the flow enters back into the evaporative heat exchanger 210 at the inlet 310A. As previously mentioned, different fluids can have different freezing and flash point temperatures. Thus, the pre-heater 222 can be implemented in some cases to increase the temperature of a flow of fluid used in order to prevent the fluid from freezing and/or to allow or facilitate a phase change of the fluid at the evaporative heat exchanger 210. For example, if a fluid used has a higher flash point temperature, the pre-heater 222 can increase the temperature of the fluid before it enters the evaporative heat exchanger 210. The higher temperature of the fluid can help or allow the evaporative heat exchanger 210 to boil or evaporate the fluid into a gas/vapor or a two-phase mixture.

In some examples, the flow channel 320 can optionally include a surge tank 230 prior to the evaporative heat exchanger 210. The surge tank 230 can serve as an accumulator to accommodate for volume of the flow and regulate pressure of the flow. In some examples, the surge tank 230 can be implemented depending on the operating environment to control the saturation pressure for the flow.

In some examples, the configuration of the two-phase cooling loop 300 described herein can help reduce the size, weight, and/or power of the overall thermal management system implemented for the ADSC 110. For example, the configuration of the two-phase cooling loop 300 can be implemented with a smaller pump with lower energy consumption requirements. Moreover, the two-phase cooling loop 300 can provide better thermal management performance for the ADSC 110, with more isothermal, higher heat flux capabilities, dielectric fluids, support for a larger range of operating and environmental temperatures, etc.

Figure 4A:
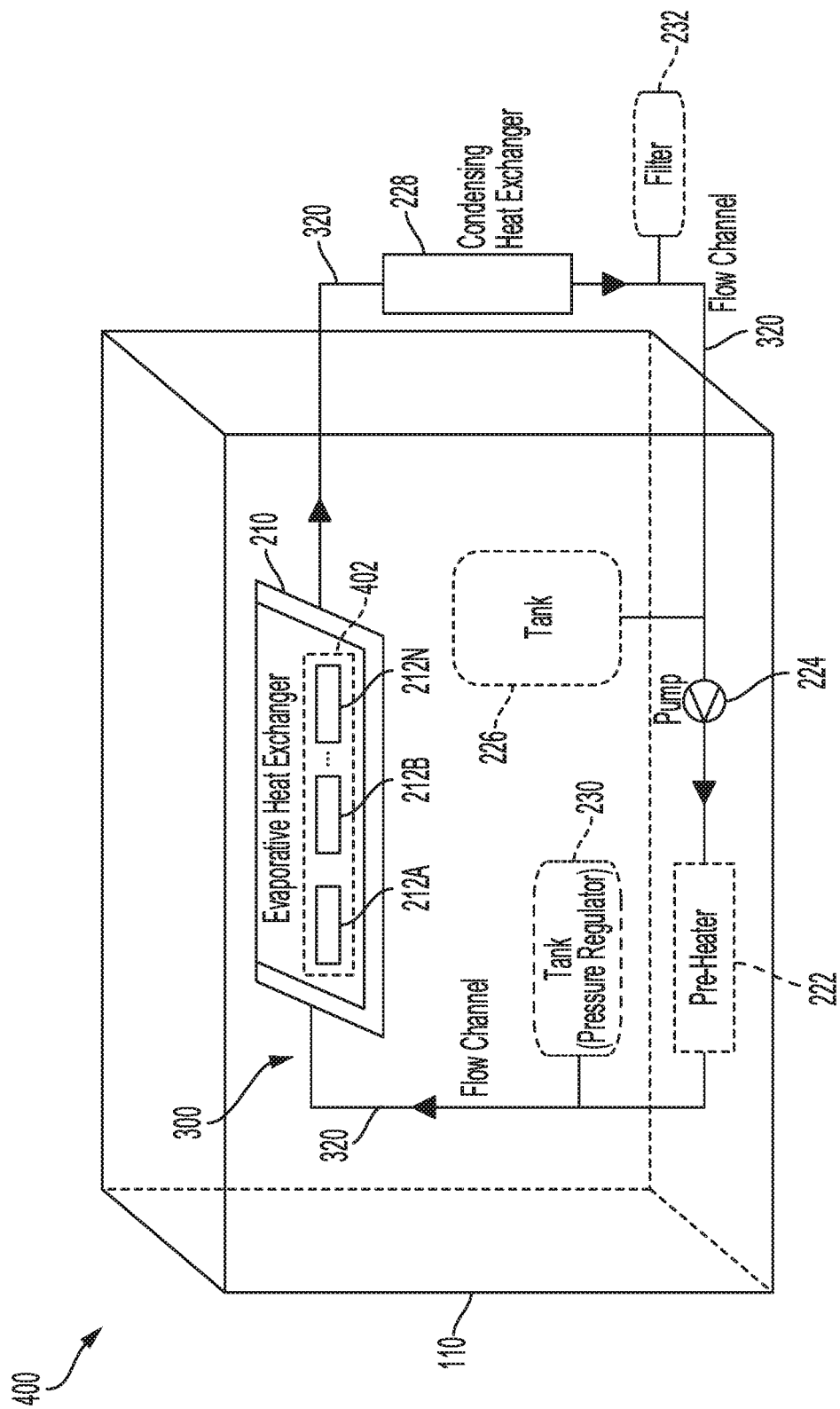
FIGS. 4A through 4E are schematic diagrams illustrating example implementations of a two-phase cooling loop in an autonomous driving super computer, in accordance with some examples.

FIG. 4A is a schematic diagram illustrating an example implementation 400 of the two-phase cooling loop 300 in the ADSC 110. In this example, the computing components 212 of the ADSC 110 are coupled directly or indirectly to an evaporative heat exchanger 210, such as a cold plate. In some cases, the computing components 212 can be coupled to a board 402, such as a printed circuit board (PCB) or a motherboard, which can be disposed on the evaporative heat exchanger 210. The evaporative heat exchanger 210 and the flow channel 320 can provide cooling to the board 402 and the computing components 212 on the board 402.

In some examples, a portion of the two-phase cooling loop 300 can be housed within the ADSC 110 and another portion of the two-phase cooling loop 300 can be external to the ADSC 110. For example, the evaporative heat exchanger 210, the pre-heater 222, the pump 224, the tank 226, the surge tank 230, the filter 232, and a portion of the flow channel 320 connecting to the evaporative heat exchanger 210, the pre-heater 222, the pump 224, the tank 226, the surge tank 230, and/or the filter 232 are housed within the ADSC 110. The condensing heat exchanger 228 and a portion of the flow channel 320 connecting to the condensing heat exchanger 228 can reside outside of the ADSC 110. The condensing heat exchanger 228 and the portion of the flow channel 320 connecting to the condensing heat exchanger 228 can reside on the autonomous vehicle 102 on a location outside of the ADSC 110. In some examples, the filter 232 can also reside outside of the ADSC 110.

In other examples, the entire two-phase cooling loop 300 can be housed within the ADSC 110. For example, the evaporative heat exchanger 210, the pre-heater 222, the pump 224, the tank 226, the condensing heat exchanger 228, the surge tank 230, the filter 232, and the flow channel 320 can all be housed within the ADSC 110. In other examples, one or more other portions or components of the two-phase cooling loop 300 can be external to the ADSC 110. For example, the pump 224, the tank 226, the condensing heat exchanger 228, the surge tank 230, and/or the filter 232 can be housed on the autonomous vehicle 102 at a location outside of the ADSC 110.

Moreover, in some cases, the flow channel 320 and/or the condensing heat exchanger 228 can be configured to transfer heat away from the ADSC 110 and towards an area of the autonomous vehicle 102. For example, in some cases, the condensing heat exchanger 228 can be configured to transfer heat to a cooling loop of an air conditioning system on the autonomous vehicle 102. The cooling loop of the air conditioning system can carry heat away from the two-phase cooling loop 300 and the ADSC 110.

In some cases, the evaporative heat exchanger 210 can be a global cold plate that is directly or indirectly coupled to all of the computing components 212 of the ADSC 110. For example, the computing components 212 of the ADSC 110 can be coupled to a board 402 disposed on the evaporative heat exchanger 210. In other cases, the evaporative heat exchanger 210 can be a cold plate directly or indirectly coupled to one or more individual computing components 212A, 212B, or 212N of the ADSC 110.

Figure 4B:
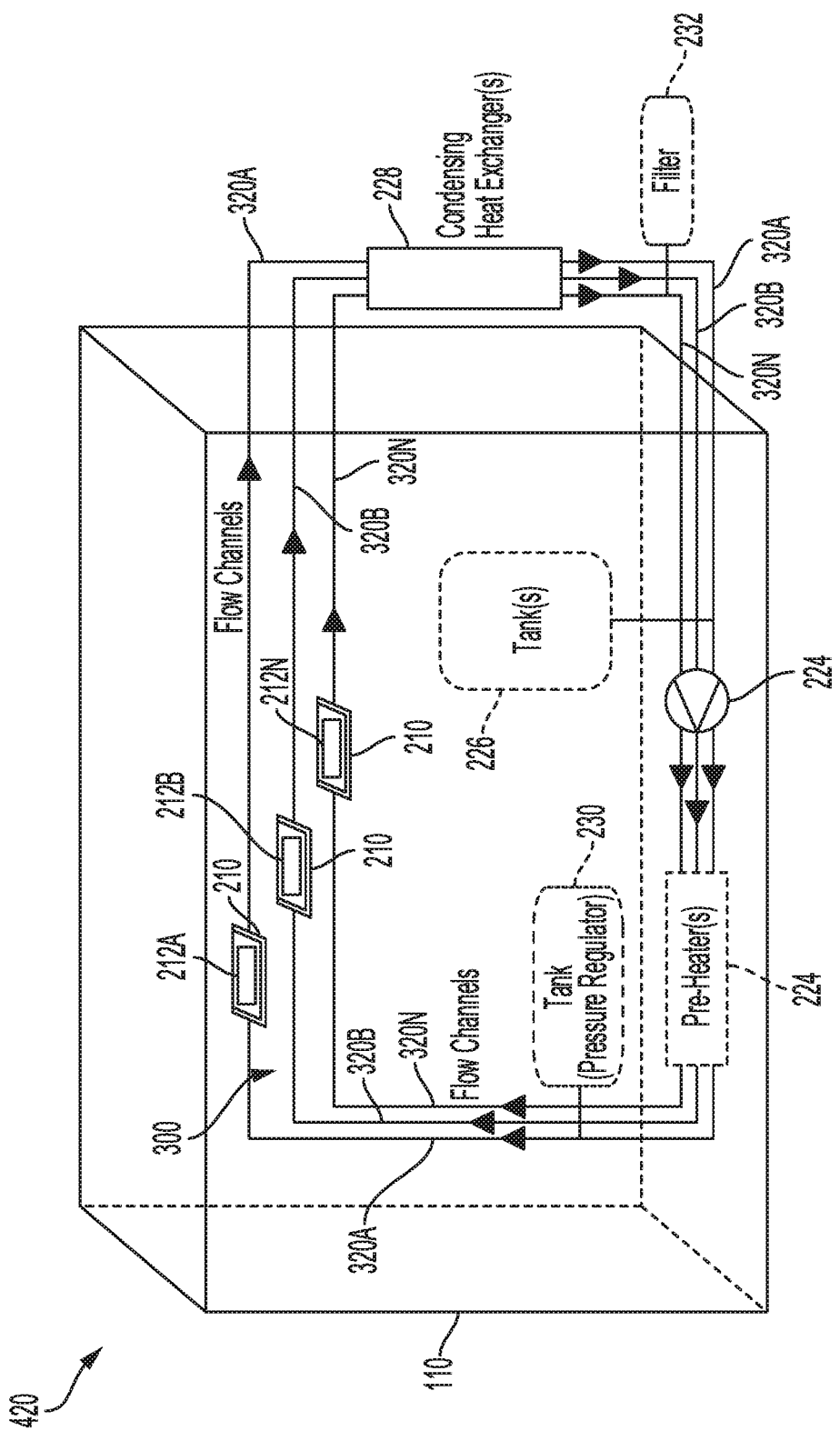

FIG. 4B is a schematic diagram illustrating another example implementation 420 of the two-phase cooling loop 300 in the ADSC 110. In this example, the two-phase cooling loop 300 includes multiple flow channels 320A-N connected to multiple evaporative heat exchangers 210 (e.g., cold plates).

In some examples, the computing components 212A-N of the ADSC 110 are disposed across the different evaporative heat exchangers 210, with each evaporative heat exchanger 210 having one or more computing components thereon. For example, computing component 212A can be coupled directly or indirectly to the evaporative heat exchanger 210 connected to flow channel 320A, computing component 212B can be coupled directly or indirectly to the evaporative heat exchanger 210 connected to flow channel 320B, and computing component 212N can be coupled directly or indirectly to the evaporative heat exchanger 210 connected to flow channel 320N. This way, each evaporative heat exchanger 210 and each flow channel 210A-N can provide cooling and thermal management to one or more computing components of the ADSC 110. In some examples, a board, such as a PCB, can be disposed on each evaporative heat exchanger 210, and each board can have a computing component (e.g., 212A-N) coupled thereto.

In some examples, each flow channel 320A-N can be connected to a different, respective pre-heater 224, pump 224, tank 226, condensing heat exchanger 228, surge tank 230, and/or filter 232 effectively forming separate two-phase cooling loops (e.g., 300). In other examples, the flow channels 320A-N can share, implement, and/or connect to a same pre-heater 224, pump 224, tank 226, condensing heat exchanger 228, surge tank 230, and/or filter 232. Moreover, in some cases, the different evaporative heat exchangers 210 can be connected to a same flow channel.

Figure 4C:
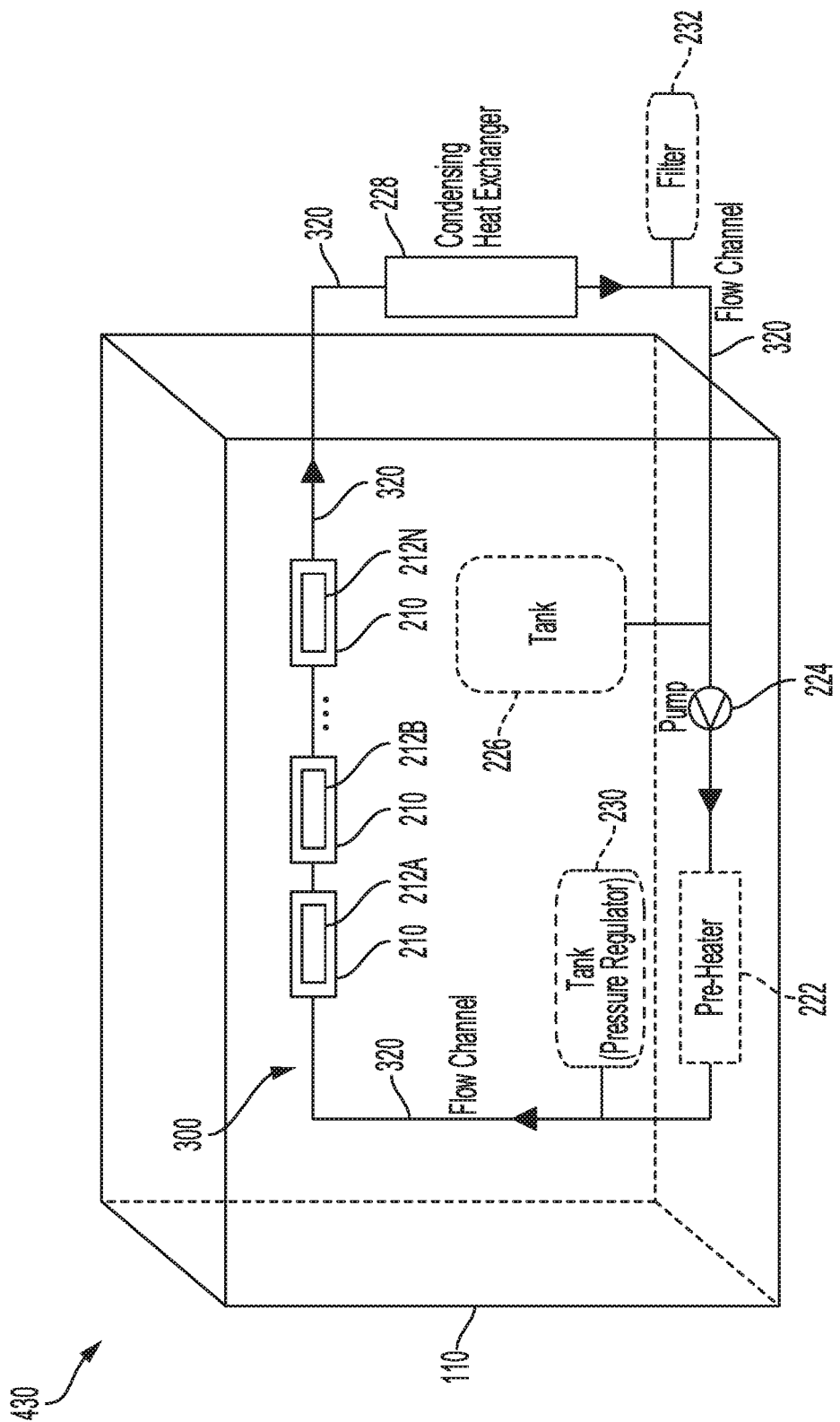

For example, with reference to the example implementation 430 shown in FIG. 4C, the different evaporative heat exchangers 210 can be connected to a single flow channel 320. The flow channel 320 can carry a flow to the different evaporative heat exchangers 210 and a two-phase mixture or gas/vapor out of the different evaporative heat exchangers 210.

In some examples, the flow channel 320 can include multiple internal channels or microchannels. Each internal channel or microchannel can carry a flow to and from each of the different evaporative heat exchangers 210. For example, a first internal channel or microchannel within the flow channel 320 can carry a flow to one of the evaporative heat exchangers 210 and a two-phase mixture or gas/vapor out of that particular one of the evaporative heat exchangers 210. A second internal channel or microchannel within the flow channel 320 can carry a flow to a different one of the evaporative heat exchangers 210 and a two-phase mixture or gas/vapor out of that different one of the evaporative heat exchangers 210. A third internal channel or microchannel within the flow channel 320 can carry a flow to yet a different one of the evaporative heat exchangers 210 and a two-phase mixture or gas/vapor out of that different one of the evaporative heat exchangers 210. This way, the flow channel 320 can include an internal channel or microchannel dedicated to each of the different evaporative heat exchangers 210.

In some cases, the two-phase cooling loop 300 can include a single pre-heater 222 (optionally), a single pump 224, a single tank 226, a single condensing heat exchanger 228, a single surge tank 230, and a single filter 232 to process any flow (e.g., fluid, two-phase mixture, and/or gas/vapor) to and from the different evaporative heat exchangers 210. For example, the two-phase cooling loop 300 can include a single pre-heater 222, a single pump 224, a single tank 226, a single condensing heat exchanger 228, a single surge tank 230, and a single filter 232 that connect to respective internal channels or microchannels that carry respective flows (e.g., fluid, two-phase mixture, and/or gas/vapor) to and from the different evaporative heat exchangers 210. Each of the internal channels or microchannels can be dedicated to a different evaporative heat exchanger 210. Thus, through the different internal channels or microchannels, the single pre-heater 222, the single pump 224, the single tank 226, the single condensing heat exchanger 228, the single surge tank 230, and the single filter 232 can each process a different flow associated with each of the evaporative heat exchangers 210.

With reference to FIGS. 4B and 4C, in some examples, a portion of the two-phase cooling loop 300 (or two-phase cooling loops) can be housed within the ADSC 110 and another portion of the two-phase cooling loop 300 (or two-phase cooling loops) can be external to the ADSC 110. For example, the evaporative heat exchangers 210, the pre-heater(s) 222, the pump(s) 224, the tank(s) 226, the surge tank(s) 230, the filter(s) 232 and a portion of the flow channels 320A-N connecting to the evaporative heat exchangers 210, the pre-heater(s) 222, the pump(s) 224, the tank(s) 226, the surge tank(s) 230, and the filter(s) 232 can be housed within the ADSC 110. The condensing heat exchanger(s) 228 and a portion of the flow channel(s) (e.g., 320 or 320A-N) connecting to the condensing heat exchanger(s) 228 can reside outside of the ADSC 110. For example, the condensing heat exchanger(s) 228 and the portion of the flow channel(s) (e.g., 320 or 320A-N) connecting to the condensing heat exchanger(s) 228 can reside on the autonomous vehicle 102 on a location outside of the ADSC 110.

Figure 4D:
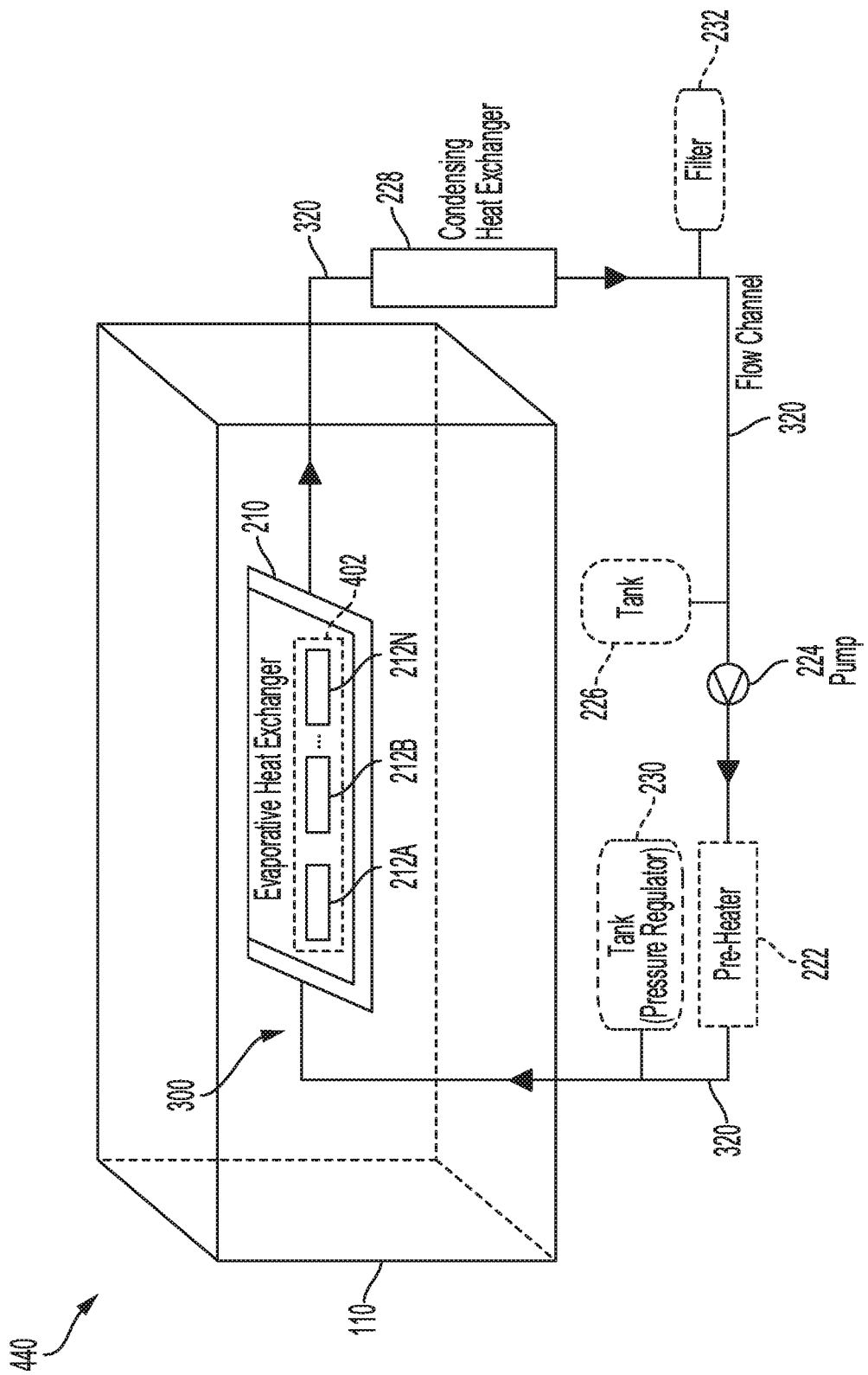
Figure 4E:
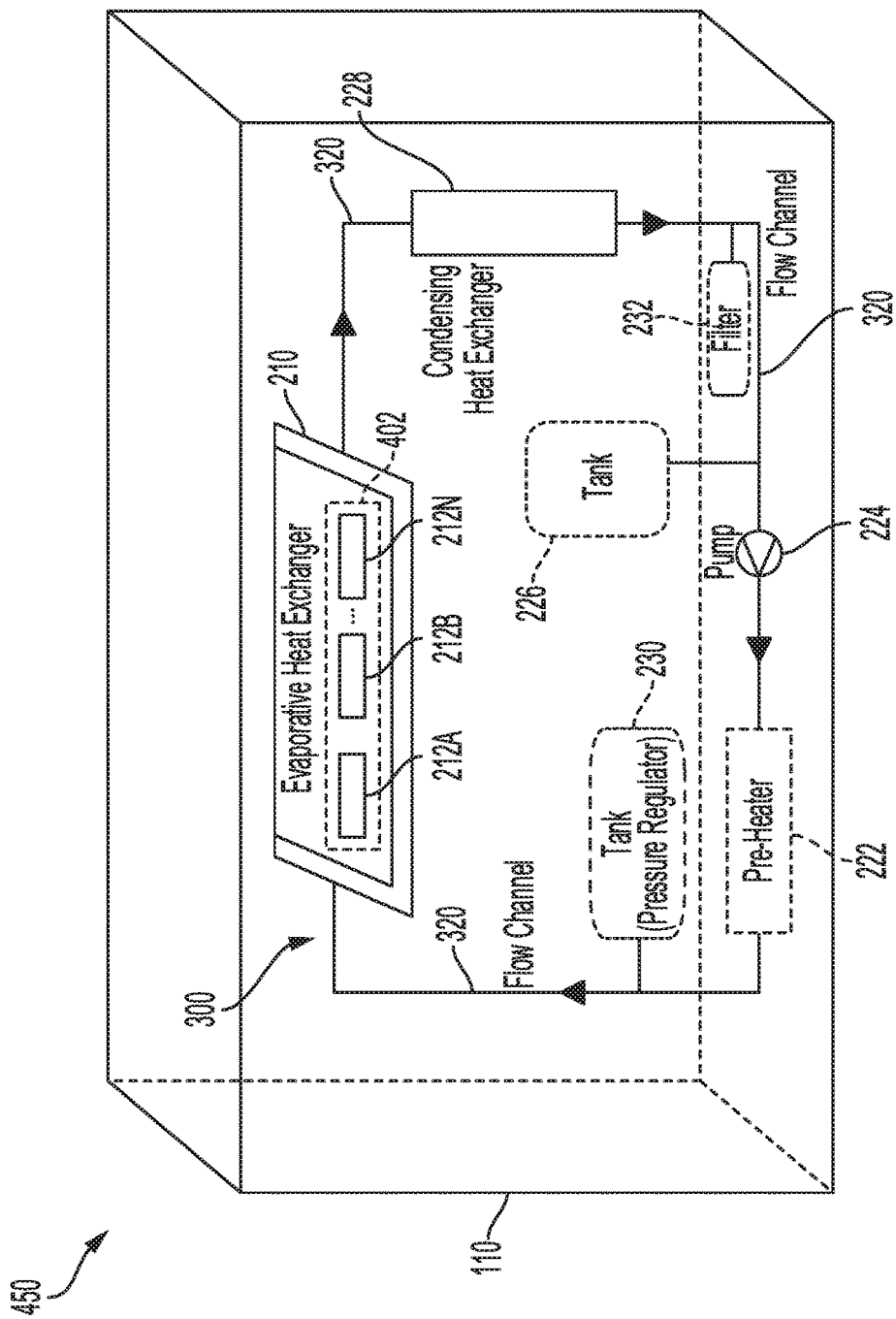

To illustrate, with reference to the example implementation 440 shown in FIG. 4D, the evaporative heat exchanger 210, the computing components 212A-N, and a portion of the flow channel 320 connecting to the evaporative heat exchanger 210 can be housed within the ADSC 110, while the pre-heater 222, the pump 224, the tank 226, the condensing heat exchanger 228, the surge tank 230, and/or the filter 232 can reside outside of the ADSC 110.

In this example, the computing components 212A-N are coupled to a board 402, which can include one or more PCBs or motherboards, disposed on the evaporative heat exchanger 210. In other examples, more or less computing components than those shown in FIG. 4D can be disposed on the evaporative heat exchanger 210 and/or the board 402. For example, in some cases, only one computing component or a subset of computing components of the ADSC 110 are disposed on the evaporative heat exchanger 210 and/or the board 402. Thus, the number of evaporative heat exchangers 210, the number of computing components on any individual evaporative heat exchanger 210, the number of flow channels 320, the number of pre-heaters 222, the number of pumps 224, the number of tanks 226, the number of condensing heat exchangers 228, the number of surge tanks 230, and the number of filters 232 can vary in different implementations based on one or more factors such as, for example, cost, size constraints, cooling requirements, power constraints, the number and/or type of computing components in the ADSC 110, the type of autonomous vehicle 102, the environment associated with the autonomous vehicle 102, and/or any other factors.

In some examples, one or more other portions or components of the two-phase cooling loop 300 (or two-phase cooling loops) can be external to the ADSC 110. For example, any of the pump(s) 224, the tank(s) 226, the condensing heat exchanger(s) 228, the surge tank(s) 230, and/or the filters 232 can be housed on the autonomous vehicle 102 at a location outside of the ADSC 110. In other examples, the entire two-phase cooling loop 300 (or two-phase cooling loops) can be housed within the ADSC 110. For example, with reference to the example implementation 450 shown in FIG. 4E, the evaporative heat exchanger 210, the pre-heater 222, the pump 224, the tank 226, the condensing heat exchanger 228, the surge tank 230, the filter 232, and the flow channel 320 can all be housed within the ADSC 110.

In some cases, the condensing heat exchanger 228 can include or have access to an outlet, area, interface, and/or mechanism for transferring heat from the flow processed by the condensing heat exchanger 228 to or towards a different area of the autonomous vehicle 102. For example, the condensing heat exchanger 228 can have an interface or outlet for transferring heat from the flow processed by the condensing heat exchanger 228 to a cooling loop of the autonomous vehicle 102, such as an air conditioning cooling loop.

While FIGS. 4A through 4E illustrate certain number, types, and configurations of components (e.g., evaporative heat exchangers 210, pre-heaters 222, pumps 224, tanks 226, condensing heat exchangers 228, surge tanks 230, filters 232, flow channels 320, etc.), it should be noted that the number, configuration, and/or type of components (e.g., evaporative heat exchangers 210, pre-heaters 222, pumps 224, tanks 226, condensing heat exchangers 228, surge tanks 230, filters 232, flow channels 320, etc.) in the two-phase cooling loop 300 (or two-phase cooling loops) of the ADSC 110 can vary in different implementations. The configurations of the implementations 400, 420, 430, 440, and 450 shown in FIGS. 4A through 4E are merely examples provided for illustration and explanation purposes.

Figure 5A:
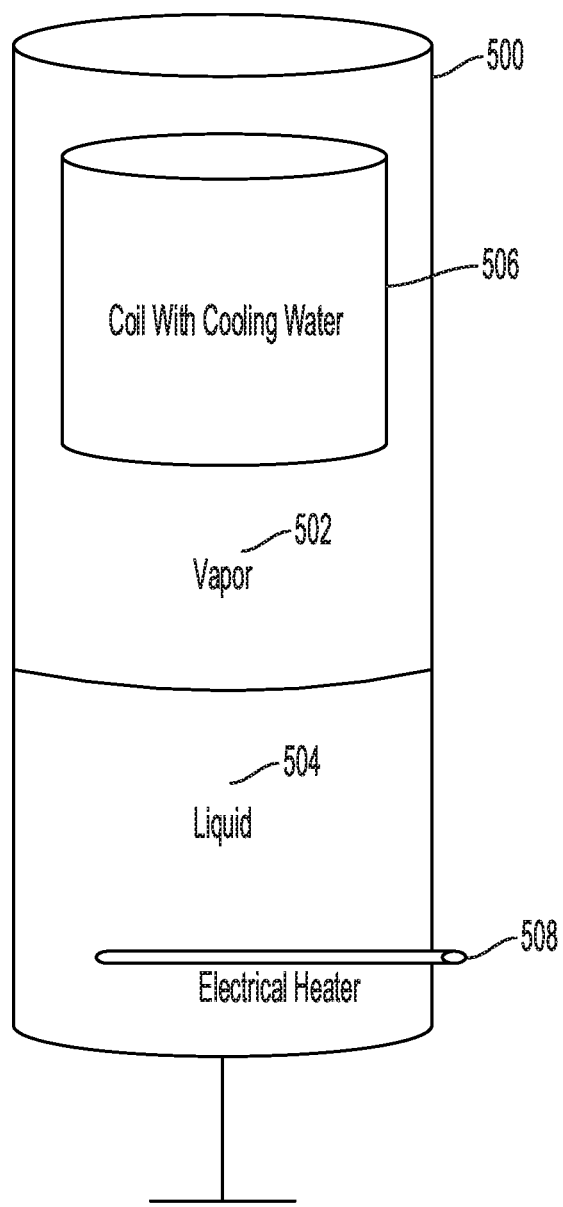
FIGS. 5A and 5B are diagrams illustrating example configurations of accumulators for accommodating flow volumes in a flow channel, in accordance with some examples.

FIG. 5A illustrates an example heat-controlled accumulator 500 for accommodating flow volumes in a flow channel 320 and regulating flow pressure, as previously described with respect to tanks 226 and 230. In some examples, the heat-controlled accumulator 500 can represent a configuration of the tank 226 and/or the tank 230 previously described.

The heat-controlled accumulator 500 can contain vapor 502 and liquid 504 obtained from the flow channel 320. The heat-controlled accumulator 500 can include a coil 506 with cooling liquid (e.g., water, refrigerant, etc.) where the vapor 502 resides within the heat-controlled accumulator 500, such as an upper part of the heat-controlled accumulator 500. The coil 506 can control the system pressure by condensing vapor content from the vapor 502 using the cooling liquid in the coil 506. In some examples, the cooling liquid in the coil 506 can condense vapor content and thereby lower the system pressure.

The heat-controlled accumulator 500 can also include an electrical heater 508 for heating the liquid 504 in the heat-controlled accumulator 500. The electrical heater 508 can reside where the liquid 504 is contained within the heat-controlled accumulator 500. The electrical heater 508 can heat the liquid 504 to change a difference in the density of the liquid 504 and vapor 502 to control (e.g., decrease) the liquid flow.

Figure 5B:
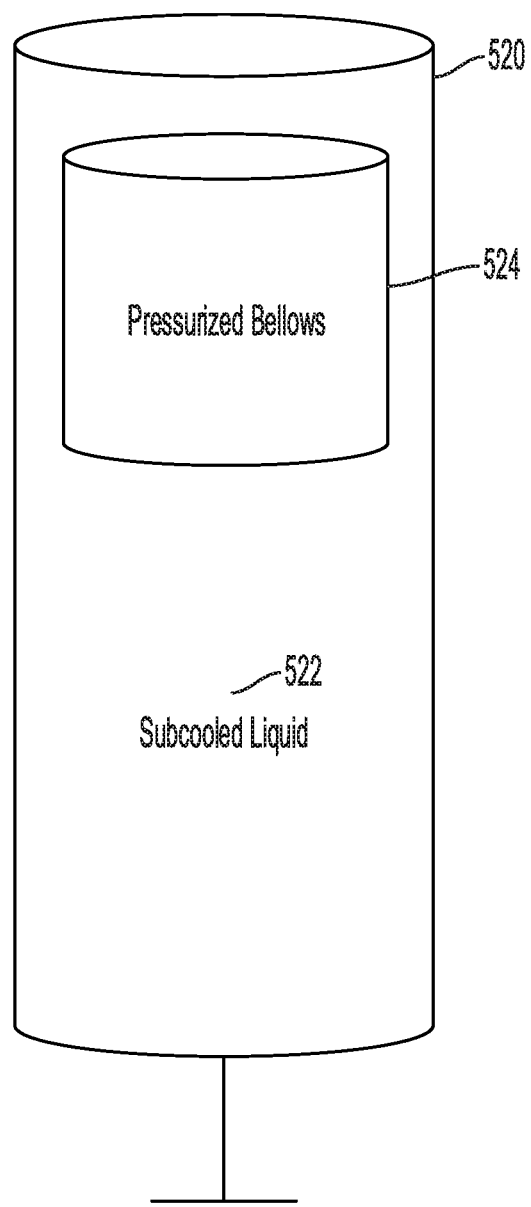

FIG. 5B illustrates an example pressure-controlled accumulator 520 for accommodating flow volumes in a flow channel 320 and regulating flow pressure, as previously described with respect to tanks 226 and 230. In some examples, the pressure-controlled accumulator 520 can represent a configuration of the tank 226 and/or the tank 230 previously described.

The pressure-controlled accumulator 520 can contain subcooled liquid 522 and pressurized bellows 524. The pressurized bellows 524 can be included within the subcooled liquid 52 and can emit air to maintain and/or change a pressure of the liquid in the pressure-controlled accumulator 520 and the liquid leaving the pressure-controlled accumulator 520 into the flow channel 320.

Having disclosed some example system components and concepts, the disclosure now turns to FIG. 6, which illustrates an example method 600 for thermal management in autonomous driving super computers using a two-phase cooling system. The steps outlined herein are exemplary and can be implemented in any combination thereof, including combinations that exclude, add, or modify certain steps.

At block 602, the method 600 can include releasing, by an evaporative heat exchanger (e.g., 210) of a two-phase cooling system (e.g., 300) for an ADSC (e.g., 110), vapor generated by the evaporative heat exchanger based on fluid received from a flow channel (e.g., 320). In some examples, the evaporative heat exchanger can release the vapor through an outlet (e.g., 310B) to the flow channel. Moreover, in some examples, the evaporative heat exchanger can include a cold plate or a phase-change heat exchanger.

The flow channel can be configured to circulate one or more flows in a closed-loop. In some cases, the one or more flows can include fluid, vapor, or a two-phase mixture of fluid and vapor.

At block 604, the method 600 can include transferring, by the evaporative heat exchanger, heat (e.g., 302) away from one or more components (e.g., 212) of the ADSC. In some examples, the evaporative heat exchanger can transfer the heat via the vapor released through the outlet to the flow channel.

In some examples, the one or more components of the ADSC can include one or more processors, printed circuit boards, motherboards, memories, field-programmable gate arrays, application-specific integrated circuits, storage devices, system-on-chips, and/or power electronics. In some cases, the one or more components can be disposed on the evaporative heat exchanger. In other examples, the evaporative heat exchanger can be coupled to a printed circuit board or motherboard, and the one or more components can be coupled to the printed circuit board or the motherboard.

In some cases, the method 600 can include collecting, by the evaporative heat exchanger from the one or more components of the ADSC, at least a portion of the heat transferred away from the one or more components of the ADSC.

At block 606, the method 600 can include receiving, by a condensing heat exchanger (e.g., 228) of the two-phase cooling system and from the flow channel, the vapor released by the evaporative heat exchanger.

At block 608, the method 600 can include condensing, by the condensing heat exchanger, the vapor to a fluid to remove latent heat associated with the vapor.

In some examples, the condensing heat exchanger can include a two-phase heat exchanger. In some examples, the condensing heat exchanger can include an inlet (e.g., 314A) to the flow channel for receiving the vapor and an outlet (e.g., 314B) to the flow channel for discharging fluid generated by condensing the vapor.

At block 610, the method 600 can include receiving, by a pump (e.g., 224) of the two-phase cooling system, the fluid from the condensing heat exchanger. In some examples, the pump can receive the fluid via an inlet to the flow channel. In some examples, the pump can include a two-phase electric pump.

At block 612, the method 600 can include circulating, by the pump, the fluid to the evaporative heat exchanger. The pump can circulate the fluid through the flow channel and towards an inlet (e.g., 310A) of the evaporative heat exchanger.

In some cases, the method 600 can include receiving, by a reservoir tank (e.g., 226) of the two-phase cooling system, overflow fluid from the flow channel. In some examples, the reservoir tank can expand or contract based on an amount of overflow fluid received from the flow channel and/or a pressure of the overflow fluid received from the flow channel. In some examples, the method 600 can include filtering (e.g., via filter 232) components of the flow in the flow channel prior to circulating the flow into the reservoir tank.

In some cases, the method 600 can include heating, by a pre-heater (e.g., 222) of the two-phase cooling system, the fluid circulated by the pump and circulating, by the pre-heater, the fluid back into the flow channel after being heated by the pre-heater.

In some cases, the method 600 can include transferring, by the condensing heat exchanger, at least a portion of the latent heat to a cooling line of an autonomous vehicle (e.g., 102).

In some examples, the method 600 can include receiving a flow from the pump and/or the pre-heater at a surge tank (e.g., 230). The surge tank can be an accumulator to accommodate volume in the flow, regulate pressure in the flow, and/or control saturation temperature for the flow prior to the flow being received by the evaporative heat exchanger.

In some examples, the flow channel, the evaporative heat exchanger and/or the condensing heat exchanger can include one or more microchannels. The microchannels can be configured to circulate one or more flows from the flow channel. The one or more flows can include, for example, fluid, vapor, or a two-phase mixture of fluid and vapor.

FIG. 7 illustrates an example computing system 700 which can be, for example, any computing device making up ADSC 110, remote computing system 150, a passenger device executing rideshare application 170, or any other computing device. In FIG. 7, the components of the computing system 700 are in communication with each other using connection 705. Connection 705 can be a physical connection via a bus, or a direct connection into processor 710, such as in a chipset architecture. Connection 705 can also be a virtual connection, networked connection, or logical connection.

In some embodiments, computing system 700 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 700 includes at least one processing unit (CPU or processor) 710 and connection 705 that couples various system components including system memory 715, such as read-only memory (ROM) 720 and random access memory (RAM) 725 to processor 710. Computing system 700 can include a cache of high-speed memory 712 connected directly with, in close proximity to, or integrated as part of processor 710.

Processor 610 can include any general purpose processor and a hardware service or software service, such as services 732, 734, and 736 stored in storage device 730, configured to control processor 710 as well as a special-purpose processor where software instructions are incorporated into the actual processor design. Processor 710 may essentially be a completely self-contained computing system, containing multiple cores or processors, a bus, memory controller, cache, etc. A multi-core processor may be symmetric or asymmetric.

To enable user interaction, computing system 700 includes an input device 745, which can represent any number of input mechanisms, such as a microphone for speech, a touch-sensitive screen for gesture or graphical input, keyboard, mouse, motion input, speech, etc. Computing system 700 can also include output device 735, which can be one or more of a number of output mechanisms known to those of skill in the art. In some instances, multimodal systems can enable a user to provide multiple types of input/output to communicate with computing system 700. Computing system 700 can include communications interface 740, which can generally govern and manage the user input and system output. There is no restriction on operating on any particular hardware arrangement, and therefore the basic features here may easily be substituted for improved hardware or firmware arrangements as they are developed.

Storage device 730 can be a non-volatile memory device and can be a hard disk or other types of computer readable media which can store data that are accessible by a computer, such as magnetic cassettes, flash memory cards, solid state memory devices, digital versatile disks, cartridges, random access memories (RAMs), read-only memory (ROM), and/or some combination of these devices.

The storage device 730 can include software services, servers, services, etc., that when the code that defines such software is executed by the processor 710, it causes the system to perform a function. In some embodiments, a hardware service that performs a particular function can include the software component stored in a computer-readable medium in connection with the necessary hardware components, such as processor 710, connection 705, output device 735, etc., to carry out the function.

For clarity of explanation, in some instances, the present technology may be presented as including individual functional blocks including functional blocks comprising devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in memory of a client device and/or one or more servers of a content management system and perform one or more functions when a processor executes the software associated with the service. In some embodiments, a service is a program or a collection of programs that carry out a specific function. In some embodiments, a service can be considered a server. The memory can be a non-transitory computer-readable medium.

In some embodiments, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer-readable media. Such instructions can comprise, for example, instructions and data which cause or otherwise configure a general purpose computer, special purpose computer, or special purpose processing device to perform a certain function or group of functions. Portions of computer resources used can be accessible over a network. The executable computer instructions may be, for example, binaries, intermediate format instructions such as assembly language, firmware, or source code. Examples of computer-readable media that may be used to store instructions, information used, and/or information created during methods according to described examples include magnetic or optical disks, solid-state memory devices, flash memory, USB devices provided with non-volatile memory, networked storage devices, and so on.

Devices implementing methods according to these disclosures can comprise hardware, firmware and/or software, and can take any of a variety of form factors. Typical examples of such form factors include servers, laptops, smartphones, small form factor personal computers, personal digital assistants, and so on. The functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

Claim language reciting "at least one of" a set indicates that one member of the set or multiple members of the set satisfy the claim. For example, claim language reciting "at least one of A and B" means A, B, or A and B.

What is claimed is:

1. A two-phase cooling system comprising:
   a flow channel configured to circulate one or more flows comprising at least one of fluid, vapor, and a two-phase mixture of fluid and vapor;
   an evaporative heat exchanger comprising a first inlet to the flow channel configured to receive a fluid from the flow channel and a first outlet to the flow channel configured to receive vapor generated based on the fluid, the evaporative heat exchanger being configured to collect heat from one or more components of a computer system of an autonomous vehicle and transfer the heat away from the one or more components via the vapor released from the first outlet to the flow channel;
   a condensing heat exchanger configured to condense the vapor generated by the evaporative heat exchanger and remove latent heat associated with the vapor, the condensing heat exchanger comprising a second inlet to the flow channel configured to receive the vapor and a second outlet to the flow channel configured to discharge fluid generated by condensing the vapor, wherein the condensing heat exchanger is configured to transfer at least a portion of the latent heat to a cooling line of the autonomous vehicle; and
   a pump connected to the flow channel, the pump being configured to receive the fluid from the condensing heat exchanger and circulate the fluid to the evaporative heat exchanger.

2. The two-phase cooling system of claim 1, further comprising:
   a reservoir tank connected to the flow channel, the reservoir tank being configured to receive overflow fluid from the flow channel, wherein the reservoir tank expands or contracts based on at least one of an amount of overflow fluid received from the flow channel and a pressure of the overflow fluid received from the flow channel.

3. The two-phase cooling system of claim 1, further comprising:
   a pre-heater configured to heat the fluid in the flow channel, the pre-heater comprising a third inlet to the flow channel for receiving the fluid from the pump and a third outlet to the flow channel for circulating the fluid back into the flow channel after being heated by the pre-heater.

4. The two-phase cooling system of claim 1, wherein the one or more components of the computer system comprise at least one of a processor, a printed circuit board, a motherboard, a memory, a field-programmable gate array, an application-specific integrated circuit, a storage device, a system-on-chip, and power electronics.

5. The two-phase cooling system of claim 4, wherein the one or more components are disposed on the evaporative heat exchanger.

6. The two-phase cooling system of claim 1, wherein the evaporative heat exchanger is coupled to a printed circuit board or a motherboard, wherein the one or more components are coupled to the printed circuit board or the motherboard, the one or more components comprising at least one of a processor, a memory, a field-programmable gate array, and an application-specific integrated circuit.

7. The two-phase cooling system of claim 1, wherein the evaporative heat exchanger comprises at least one of a cold plate and a phase-change heat exchanger, and wherein the pump comprises a two-phase electric pump.

8. The two-phase cooling system of claim 1, wherein the condensing heat exchanger comprises a two-phase heat exchanger, wherein the cooling line comprises a loop or channel of an air conditioning system of the autonomous vehicle, the condensing heat exchanger being configured to transfer at least the portion of the latent heat to the loop or channel of the air conditioning system of the autonomous vehicle.

9. The two-phase cooling system of claim 1, wherein at least one of the flow channel, the evaporative heat exchanger and the condensing heat exchanger comprises one or more microchannels, the microchannels being configured to circulate the one or more flows.

10. A method comprising:
    releasing, by an evaporative heat exchanger of a two-phase cooling system of a computer system of an autonomous vehicle, vapor generated by the evaporative heat exchanger based on fluid received from a flow channel, the vapor being released through an outlet to the flow channel;
    transferring, by the evaporative heat exchanger, heat away from one or more components of the computer system, the heat being transferred via the vapor released through the outlet to the flow channel;
    receiving, by a condensing heat exchanger of the two-phase cooling system and from the flow channel, the vapor released by the evaporative heat exchanger;
    condensing, by the condensing heat exchanger, the vapor to a fluid to remove latent heat associated with the vapor, wherein the condensing heat exchanger is configured to transfer at least a portion of the latent heat to a cooling line of the autonomous vehicle;
    receiving, by a pump of the two-phase cooling system, the fluid from the condensing heat exchanger, the fluid being received by the pump via an inlet to the flow channel; and
    circulating, by the pump, the fluid to the evaporative heat exchanger, the fluid being circulated through the flow channel.

11. The method of claim 10, further comprising:
    receiving, by a reservoir tank of the two-phase cooling system, overflow fluid from the flow channel, wherein the reservoir tank expands or contracts based on at least one of an amount of overflow fluid received from the flow channel and a pressure of the overflow fluid received from the flow channel.

12. The method of claim 10, further comprising:
heating, by a pre-heater of the two-phase cooling system, the fluid circulated by the pump; and
circulating, by the pre-heater, the fluid back into the flow channel after being heated by the pre-heater.

13. The method of claim 10, wherein the one or more components of the computer system comprise at least one of a processor, a printed circuit board, a motherboard, a memory, a field-programmable gate array, an application-specific integrated circuit, a storage device, a system-on-chip, and power electronics.

14. The method of claim 13, wherein the one or more components are disposed on the evaporative heat exchanger.

15. The method of claim 10, wherein the evaporative heat exchanger is coupled to a printed circuit board or a motherboard, wherein the one or more components are coupled to the printed circuit board or the motherboard, the one or more components comprising at least one of a processor, a memory, a field-programmable gate array, and an application-specific integrated circuit.

16. The method of claim 10, wherein the evaporative heat exchanger comprises at least one of a cold plate and a phase-change heat exchanger, wherein the pump comprises a two-phase electric pump, and wherein the condensing heat exchanger comprises a two-phase heat exchanger.

17. The method of claim 10, wherein the cooling line comprises a loop or channel of an air conditioning system of the autonomous vehicle, the condensing heat exchanger being configured to transfer at least the portion of the latent heat to the loop or channel of the air conditioning system of the autonomous vehicle.

18. The method of claim 10, wherein at least one of the flow channel, the evaporative heat exchanger and the condensing heat exchanger comprises one or more microchannels, the microchannels being configured to circulate one or more flows from the flow channel.

19. The method of claim 10, wherein the evaporative heat exchanger comprises a global cold plate directly or indirectly coupled to all computing components of the computer system.

20. An autonomous vehicle comprising:
a computer system; and
a two-phase cooling system for the computer system, the two-phase cooling system comprising:
a flow channel configured to circulate one or more flows comprising at least one of fluid, vapor, and a two-phase mixture of fluid and vapor;
an evaporative heat exchanger comprising a first inlet to the flow channel for receiving a fluid from the flow channel and a first outlet to the flow channel for releasing vapor generated based on the fluid, the evaporative heat exchanger being configured to collect heat from one or more components of the computer system and transfer the heat away from the one or more components via the vapor released from the first outlet to the flow channel;
a condensing heat exchanger configured to condense the vapor generated by the evaporative heat exchanger and remove latent heat associated with the vapor, the condensing heat exchanger comprising a second inlet to the flow channel for receiving the vapor and a second outlet to the flow channel for discharging fluid generated by condensing the vapor, wherein the condensing heat exchanger is configured to transfer at least a portion of the latent heat to a cooling line of the autonomous vehicle; and
a pump connected to the flow channel, the pump being configured to receive the fluid from the condensing heat exchanger and circulate the fluid to the evaporative heat exchanger.

* * * * *